US006929091B2

(12) United States Patent
Bertagni et al.

(10) Patent No.: US 6,929,091 B2
(45) Date of Patent: Aug. 16, 2005

(54) PLANAR DIAPHRAGM LOUDSPEAKER AND RELATED METHODS

(75) Inventors: Alejandro Bertagni, Lake Forest, CA (US); Eduardo Bertagni, Tustin, CA (US); Alfredo Ferrin, Santa Ana, CA (US)

(73) Assignee: Sound Advance Systems, Inc., Santa Ana, CA (US)

( * ) Notice: Subject to any disclaimer, the term of this patent is extended or adjusted under 35 U.S.C. 154(b) by 0 days.

(21) Appl. No.: 10/696,721

(22) Filed: Oct. 27, 2003

(65) Prior Publication Data

US 2004/0129492 A1 Jul. 8, 2004

Related U.S. Application Data

(60) Provisional application No. 60/421,718, filed on Oct. 28, 2002.

(51) Int. Cl.[7] .......................... H05K 5/02; G10K 13/00; H04R 7/02

(52) U.S. Cl. ....................... 181/150; 181/173; 381/423; 381/202; 381/431; 381/203; 381/424

(58) Field of Search ................................ 181/150, 161, 181/173, 174, 169, 170; 381/423, 202, 152, 191, 429, 431, 203, 428, 426, 424

(56) References Cited

U.S. PATENT DOCUMENTS 1,990,409 A * 2/1935 Lawrance .................... 181/164
2,531,634 A * 11/1950 Lawrance .................... 181/164
2,657,758 A * 11/1953 Varnet ......................... 181/164
3,046,362 A 7/1962 White ...................... 179/115.5
3,073,411 A * 1/1963 Bleazey et al. ............. 181/173
3,596,733 A 8/1971 Bertagni ....................... 181/32
3,674,109 A * 7/1972 Murase ........................ 181/170
3,722,617 A 3/1973 Bertagni ....................... 181/32
3,737,005 A 6/1973 Tontini ......................... 181/33

(Continued)

FOREIGN PATENT DOCUMENTS

JP 59004400 1/1984

*Primary Examiner*—Edgardo San Martin
(74) *Attorney, Agent, or Firm*—Sheppard, Mullin, Richter & Hampton L.L.P.

(57) ABSTRACT

A planar diaphragm loudspeaker for use in a suspended ceiling grid and related methods of manufacturing are provided. The loudspeaker includes a rectangular, planar diaphragm of polymer material sized to fill an opening of the ceiling grid. The front surface of the diaphragm defines a three-dimensional, textured pattern formed by a secondary operation, such as, etching, perforating, and adhesion of granular or fiber material. The diaphragm may include an outer region about the periphery of the diaphragm having a density of at least 5 pcf and an inner region circumscribed by the outer region, thereby providing sufficient structural stiffness to the outside perimeter of the diaphragm and eliminating the need of an outer frame. The density of the inner region is at or below about 3 pcf throughout the inner region. Also, a shroud may secured to the diaphragm, in which the shroud and the diaphragm are securable in a first orientation for flush mounting or in a second orientation for tegular-drop mounting. The loudspeaker may also include a bracket rigidly attached to the diaphragm at two spaced locations in the outer region and extending across the inner region between the spaced locations.

19 Claims, 37 Drawing Sheets

U.S. PATENT DOCUMENTS

| | | | | | |
|---|---|---|---|---|---|
| 3,779,336 | A | | 12/1973 | Bertagni | 181/31 |
| 3,792,394 | A | | 2/1974 | Bertagni | 335/299 |
| 3,801,943 | A | | 4/1974 | Bertagni | 335/231 |
| 3,834,486 | A | * | 9/1974 | Tsuge et al. | 181/165 |
| 3,912,865 | A | | 10/1975 | Seebinger | 179/1 |
| 3,991,286 | A | | 11/1976 | Henricksen | 179/115.5 |
| 4,003,449 | A | | 1/1977 | Bertagni | 181/173 |
| 4,013,846 | A | | 3/1977 | Krawczak et al. | 179/115.5 |
| 4,040,213 | A | * | 8/1977 | Capaul | 181/291 |
| 4,138,593 | A | | 2/1979 | Hasselbach et al. | 179/1 |
| 4,184,563 | A | | 1/1980 | Bertagni | 181/171 |
| 4,252,211 | A | * | 2/1981 | Matsuda et al. | 181/173 |
| 4,257,325 | A | | 3/1981 | Bertagni | 181/172 |
| 4,328,400 | A | | 5/1982 | Shimada et al. | 179/116 |
| 4,413,160 | A | | 11/1983 | Ohyaba et al. | 179/115 |
| 4,760,510 | A | | 7/1988 | Lahti | 362/365 |
| 4,769,188 | A | * | 9/1988 | Graham et al. | 264/51 |
| 4,820,077 | A | | 4/1989 | Sawada et al. | 403/402 |
| 4,837,838 | A | | 6/1989 | Thigpen et al. | 381/158 |
| 4,850,023 | A | | 7/1989 | Yarush | 381/67 |
| 4,891,842 | A | * | 1/1990 | Green | 181/150 |
| 4,926,962 | A | * | 5/1990 | Graham et al. | 181/150 |
| 4,928,312 | A | | 5/1990 | Hill | 381/192 |
| 4,933,975 | A | | 6/1990 | Button | 381/192 |
| 4,997,058 | A | | 3/1991 | Bertagni | 181/166 |
| 5,007,707 | A | | 4/1991 | Bertagni | 350/118 |
| 5,425,107 | A | | 6/1995 | Bertagni et al. | 381/202 |
| 5,539,835 | A | * | 7/1996 | Bertagni et al. | 381/423 |
| 5,574,796 | A | | 11/1996 | Keezer | 381/188 |
| 5,690,423 | A | | 11/1997 | Hentz et al. | 362/365 |
| 5,693,917 | A | * | 12/1997 | Bertagni et al. | 181/173 |
| 5,937,073 | A | | 8/1999 | Van Gieson | 381/391 |
| 6,015,025 | A | * | 1/2000 | McGrath et al. | 181/150 |
| 6,386,315 | B1 | * | 5/2002 | Roy et al. | 181/150 |
| 6,411,723 | B1 | * | 6/2002 | Lock et al. | 381/431 |
| 6,481,173 | B1 | * | 11/2002 | Roy et al. | 181/150 |
| 6,510,919 | B1 | * | 1/2003 | Roy et al. | 181/173 |
| 2003/0081800 | A1 | * | 5/2003 | Klasco et al. | 381/431 |

* cited by examiner

PLANAR DIAPHRAGM LOUDSPEAKER AND RELATED METHODS

This application claims the benefit of U.S. Provisional Application No. 60/421,718, filed Oct. 28, 2002.

BACKGROUND OF THE INVENTION

The present invention relates generally to an acoustic transducer or loudspeaker and, more particularly, to planar loudspeakers for use in suspended ceilings.

Advances in dynamic loudspeakers have been provided by the advent of planar diaphragm loudspeakers. Examples of such planar loudspeakers are shown and described in U.S. Pat. Nos. 4,003,449 and 4,997,058, both issued in the name of Jose J. Bertagni. Further examples are described in U.S. Pat. Nos. 5,425,107, 5,539,835 and 5,693,917 issued to Alejandro Bertagni et al.

Planar loudspeakers can be manufactured in various shapes and sizes, and used in a multitude of applications. For example, planar loudspeakers have been used in suspended ceiling structures of the type found in commercial buildings. Such suspended ceilings typically comprise a series of metallic runners and tees forming a 2'×2' or 2'×4' grid onto which multiple acoustic ceiling tiles are placed, allowing for a uniform, uninterrupted surface appearance. When used in commercial ceiling structures, advantages by planar diaphragm loudspeakers over loudspeakers utilizing conventional cone-type diaphragms include greater dispersion of sound, economy of manufacture, ease of installation and improved aesthetic appearance. Conventional, cone-type loudspeakers have been used in commercial ceiling structures for decades. Their intended applications encompass paging, background or foreground music. Such cone-type devices require a metallic or plastic grille in the front side in order to conceal the cone—and in certain cases its hardware or a ported hole—from plain sight. Such grille is often perceived as visually unpleasant and also disrupts the continuity of the ceiling surface.

In prior planar loudspeaker approaches, two-dimensional representations have been used to mimic three-dimensional surface textures. For example, it has been previously known to have planar loudspeakers in the apparent shape of a ceiling tile which have a painted or screen-printed front surface in order to match the color and/or pattern design of the surrounding ceiling tiles, giving the installation an unobtrusive look. It is also known that a pre-printed sheet of paper can be applied over the front surface of the loudspeaker to obtain similar aesthetic results. Such example has been disclosed in U.S. Pat. Nos. 3,596,733 and 3,779,336, both issued to Jose J. Bertagni. It has also been known to have planar loudspeakers with a stretched, pre-printed fabric over the exposed front surface of the diaphragm. Such fabric is to be used for decorative purposes, and could also be screen-printed to match certain ceiling tile patterns. Such example is described in U.S. Pat. Nos. 3,596,733 and 3,779,336, both issued in the name of Jose J. Bertagni.

A recent interpretation of the latter is found in U.S. Pat. No. 6,386,315 issued to Kenneth P. Roy et al., though the fabric is stretched in front of the diaphragm but not in contact with its surface, therefore narrowing the application to acoustically transparent fabrics and therefore limiting its advantage. Although the surface finishes abovementioned have been used in commerce, they are limited to a two-dimensional representation of a three-dimensional surface, which in many cases is not completely adequate or, even more, not substantially similar to the surrounding surface of the ceiling where the loudspeaker is intended to be installed.

A further known concept is a planar-type loudspeaker with a sheet of pre-molded polymer material bonded against the front surface of the loudspeaker, intended to simulate a ceiling tile. Although it could be considered as an improvement over two-dimensional methods previously cited, the added mass and rigidity of such sheet and the lamination effect caused by the bond between the diaphragm and the decorative sheet drastically deteriorates the overall performance of the loudspeaker. The foregoing, along with the added material cost, does not seem to provide an advantage over previous embodiments. Such example can be found in U.S. Pat. No. 4,928,312 issued to Amel Hill.

Yet, a further known method provides for molding the front surface of the diaphragm to take on the appearance of an acoustic tile, permitting unobtrusive installation of the loudspeaker in ceilings of commercial structures formed of like-appearing ceiling tiles. See U.S. Pat. Nos. 5,425,107, 5,539,835 and 5,693,917 issued to Alejandro Bertagni et al. This alternative does not affect the performance of the planar loudspeaker, and it is more cost-effective than the method described in U.S. Pat. No. 4,928,312 cited above, it does limit the ability to adapt the loudspeaker's appearance for a variety of acoustic tile configurations. Nonetheless, these prior approaches have a number of shortfalls, including sound reproduction, manufacturing and material costs, and integration into the ceiling.

Accordingly, there is a need for a planar diaphragm loudspeaker for use in a suspended ceiling grid that overcomes the aforementioned difficulties and allows for unobtrusive integration. The present invention fulfills this need.

SUMMARY OF THE INVENTION

Briefly, and in general terms, the present invention resides in a planar diaphragm loudspeaker suitable for unobtrusive integration in a suspended ceiling having a plurality of ceiling tiles. Preferably, the planar diaphragm of the loudspeaker has a textured outer surface configured to resemble the tiles of the suspended ceiling. The textured planar diaphragm is configured to provide high quality sound reproduction and is relatively easy and cost-effective to manufacture. The invention also resides in related methods of manufacturing.

More specifically, in a presently preferred embodiment, by way of example and not limitation, the diaphragm includes regions having densities to provide improved sound reproduction across the audio frequency spectrum, to include low, high and very high frequencies, and to further provide sufficient structural stiffness to the outside perimeter of the diaphragm, thereby eliminating the need of an outer frame and resilient suspension.

In another detailed aspect of a preferred embodiment, the loudspeaker is configured to be selectably flush mounted or tegular-drop mounted within the suspended ceiling, as needed. For example, the shroud and the diaphragm are each provided with a pattern of protuberances and indentations on their facing surfaces such that, when the shroud and diaphragm are mated in a first orientation, the loudspeaker is configured for flush mounting, and when the shroud and diaphragm are mated in a second orientation, the loudspeaker is configured for tegular-drop mounting.

For purposes of summarizing the invention and the advantages achieved over the prior art, certain advantages of the invention have been described herein above. Of course, it is to be understood that not necessarily all such advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment disclosed.

Other features and advantages of the invention will become apparent from the following description of the preferred embodiments, taken in conjunction with the accompanying drawings, which illustrate, by way of example, the principles of the invention.

BRIEF DESCRIPTION OF THE DRAWINGS

The invention will now be described with reference to the presently preferred embodiments shown in the drawings, which are provided only as examples to illustrate the principles of the invention. The invention is not limited to the embodiments shown, and variations will be apparent to those skilled in the art. The embodiments are not shown or described in more detail than necessary to describe the invention, and the manner and process of making and using it, to those skilled in the art. In the drawings.

DETAILED DESCRIPTION OF THE PREFERRED EMBODIMENTS

Figure 1A:
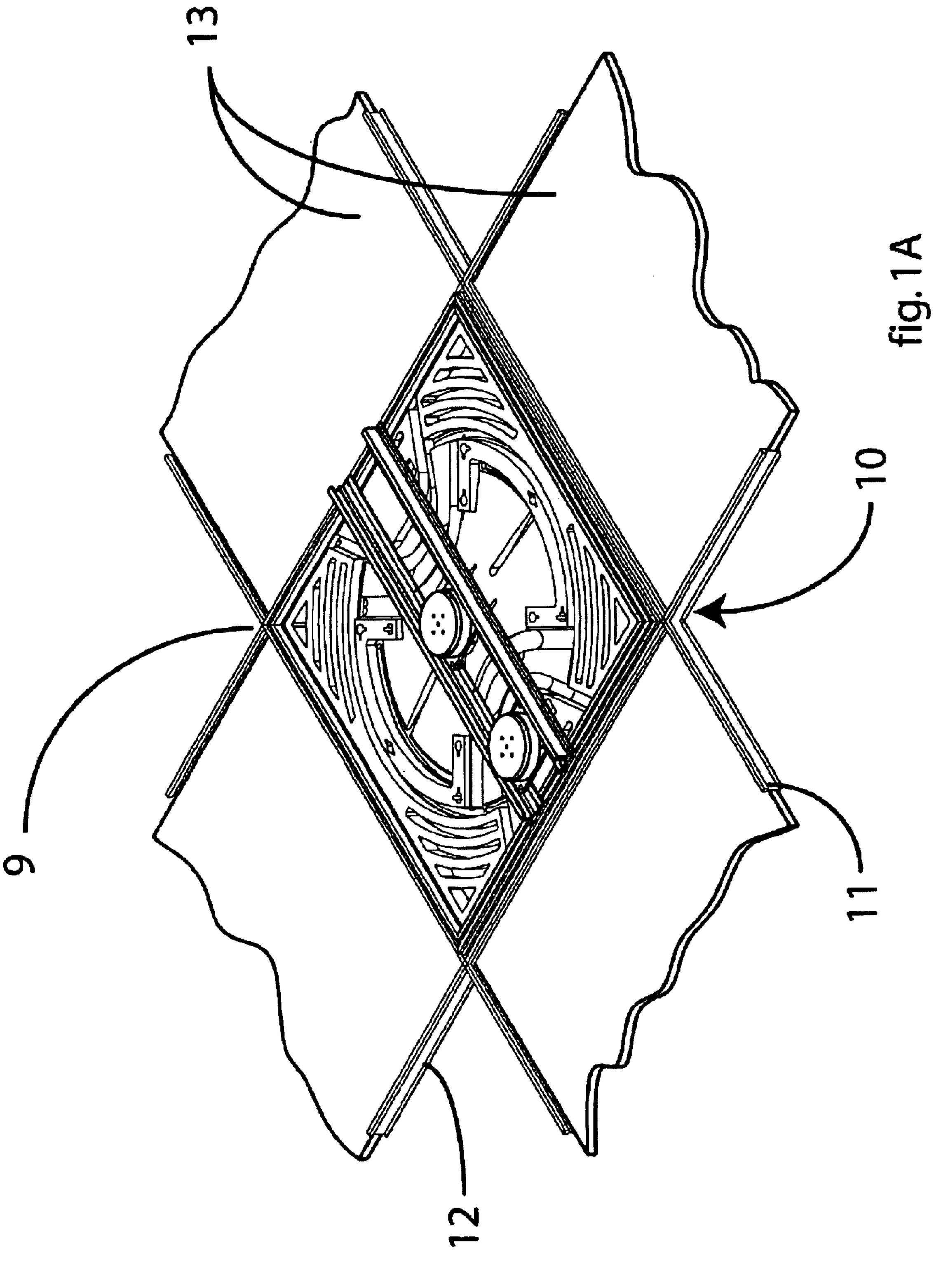
FIG. 1A is an isometric view from above, showing a planar diaphragm loudspeaker according to the present invention, being positioned in a suspended ceiling grid consisting of 2'×2' ceiling tiles.
Figure 1B:
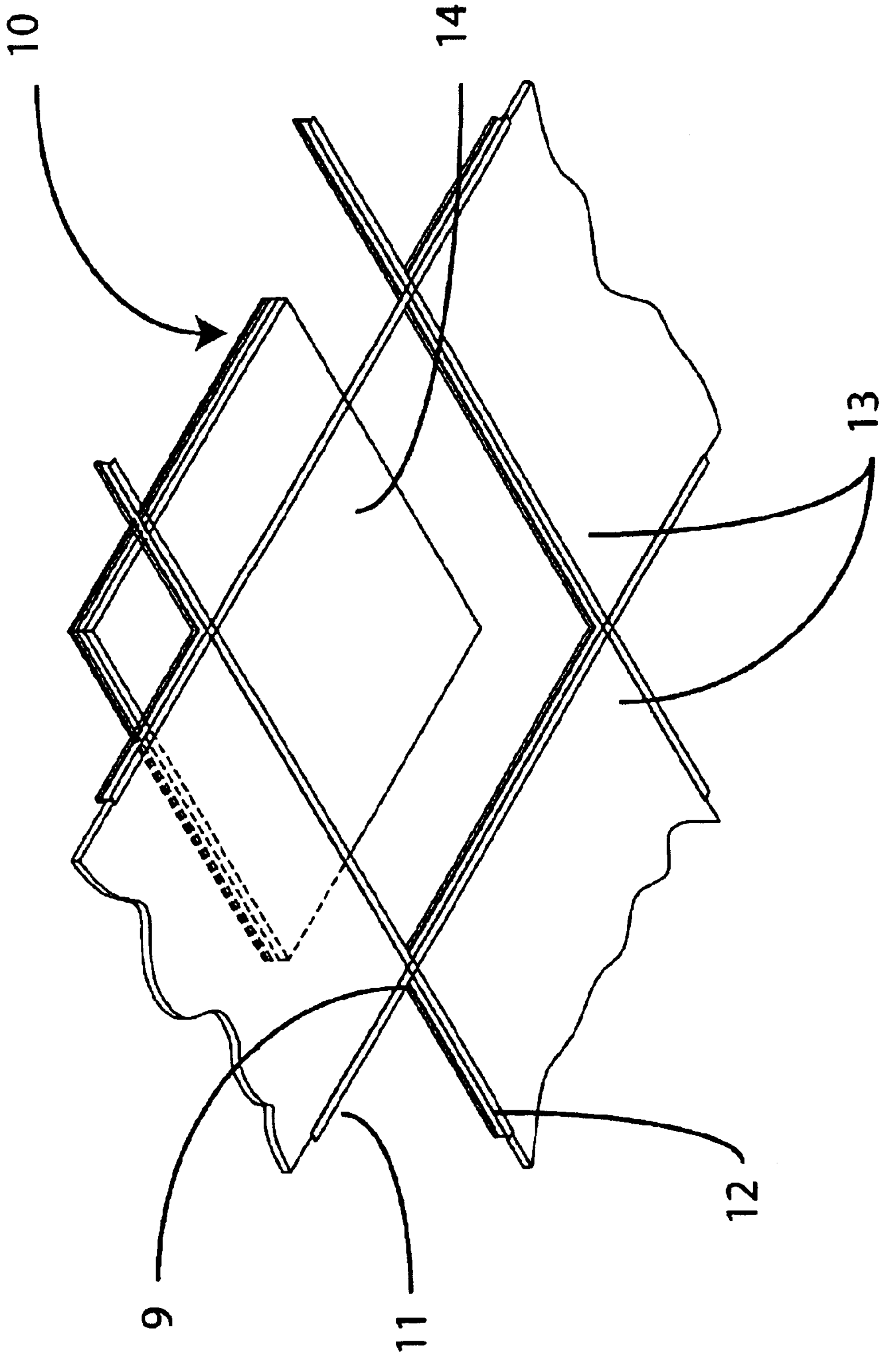
FIG. 1B is an isometric view from below, showing the same planar diaphragm loudspeaker being installed in the same ceiling grid as shown of FIG. 1.

Referring now to the drawings, and more particularly to FIGS. 1A and 1B, there is shown a planar diaphragm loudspeaker, indicated generally by reference numeral 10, suitable for use in a suspended ceiling grid 9 that typically comprise a series of metallic runners 11 and tees 12 forming a 2'×2' or 2'×4' grid onto which multiple acoustic ceiling tiles 13 are placed. The loudspeaker 10 is shown in FIG. 1B with the exposed surface 14 facing down, and ready to be placed at an opening of the suspended ceiling grid.

Figure 2A:
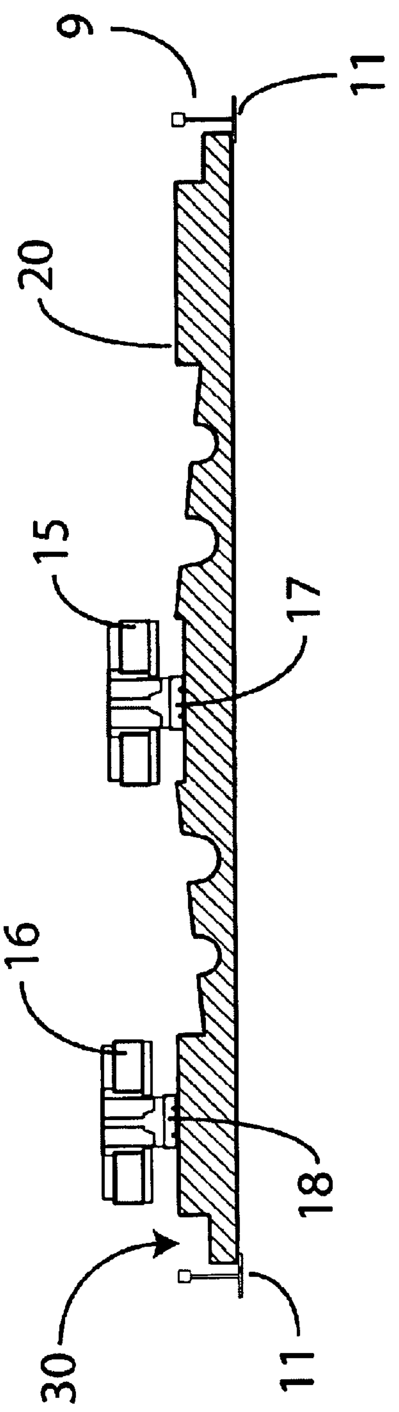
FIG. 2A is a sectional view of a dual-driver planar diaphragm loudspeaker installed in a suspended ceiling grid, showing a molded diaphragm of expandable cellular plastic material.

FIG. 2A illustrates an exemplary arrangement of a dual-driver planar diaphragm loudspeaker 30 resting on runners 11 of a suspended ceiling grid 9, whereas an electromagnetic driver assembly 15 includes a voice coil assembly 17 arranged for reproduction of low frequencies and where an electromagnetic driver assembly 16 includes a voice coil assembly 18 arranged for reproduction of high frequencies, and where both voice coil assemblies 17 and 18 are coupled with epoxy or other adhesives to the rear surface of a planar diaphragm 20 made of an expandable cellular plastic, causing the diaphragm to vibrate and reproduce sound in response to an electrical signal.

Figure 2B:
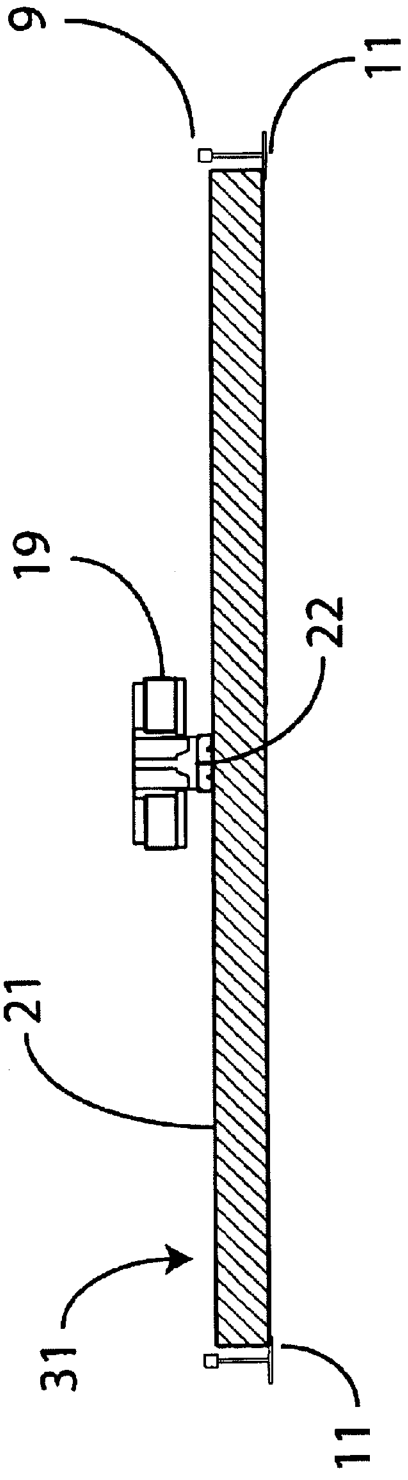
FIG. 2B is a sectional view of a single-driver planar diaphragm loudspeaker installed in a suspended ceiling grid, showing a diaphragm made of non-skinned, closed-cell polymer material.

FIG. 2B illustrates a single-driver planar diaphragm loudspeaker 31 resting on runners 11 of a suspended ceiling grid 9, whereas an electromagnetic driver assembly 19 includes a voice coil assembly 22 arranged for reproduction of low and high frequencies, and where the voice coil assembly 22 is coupled with epoxy or other adhesives to the rear surface of a planar diaphragm 21 made of a closed-cell polymer material, causing the diaphragm to vibrate and reproduce sound in response to an electrical signal. In order to simulate the appearance of the surrounding acoustic tiles where the planar loudspeaker is to be installed, alternative finishes can be accomplished over the front surface 14 of a planar loudspeaker diaphragm 10, as discussed in detail below.

In other exemplary embodiments, the planar diaphragm can be suitably constructed of closed-cell extruded or foamed polymer materials, either with or without additional skins, or only skinned on the exposed surface. Examples of polymer composite materials currently available in the market and suitable for use as a diaphragm are Kapa-Bloc® (expanded polyurethane core), Sintra® (expanded polyvinyl-chloride core), Foam-X® (extruded polystyrene core), Fome-Cor® (extruded polystyrene core), Gator-Flex® (extruded polystyrene core), Gator-Foam® (polystyrene foam core), Gator-Lite® (polystyrene foam core), Gator-Plast® (polystyrene foam core), Jet-Mount® (polystyrene foam core), Jet-Print® (polystyrene foam core) and ValuBoard® (extruded polystyrene core), available from Alcan Composites Inc. of Statesville, N.C. Skin materials for these polymers include but are not limited to paper, wood veneer, melamine and polystyrene. Other types of foamed polymer materials—either with or without skins—include expanded polyethylene foam, phenolic foam, polyisocyanurate foam, polyolefin foam, semi-rigid polyurethane foam with integral skins and microcellular foams. Most of these materials can be shape-formed and are also available in sheet-form of various sizes, thickness and densities for further machining to specific shapes, if required. Examples of such materials include: Airex® (polyetherimide closed cell thermoplastic foam core), Airlite-Herex® (cross-linked polyvinyl chloride closed-cell foam core) and Kapex® (modified polyurethane closed cell foam core) available from Alcan/Baltek Corp. of Northvale, N.J.; Klegcell® (cross-linked polyvinyl chloride rigid closed cell foam), Divinycell® (cross-linked polyvinyl chloride rigid closed cell foam) and TBR® (cross-linked polyvinyl chloride rigid closed cell foam) available from DIAB International of DeSoto, Tex.; PolyCore® (rigid polyisocyanurate foam core), Thermo-Cor® (rigid closed cell phenolic foam) and Epoxycore® (cross-linked novolacepoxy resin (hybrid phenolic/urethane)) available from American Foam Technologies of Lewisburgh, W. Va.; Last-A-Foam® (closed cell, flame retardant foam) available from General Plastics Manufacturing Co. of Tacoma, Wash.; Plasticell® (closed cell phenolic foam), Permaglass® (fire resistant glass fiber/phenolic laminate) available from Permali Gloucester Ltd. of Gloucester, UK; and Wilsonart® (solid phenolic core panels) available from Wilsonart International of Temple, Tex.

A. Textured Front Surface

1. Textured Impressions

Figure 3A:
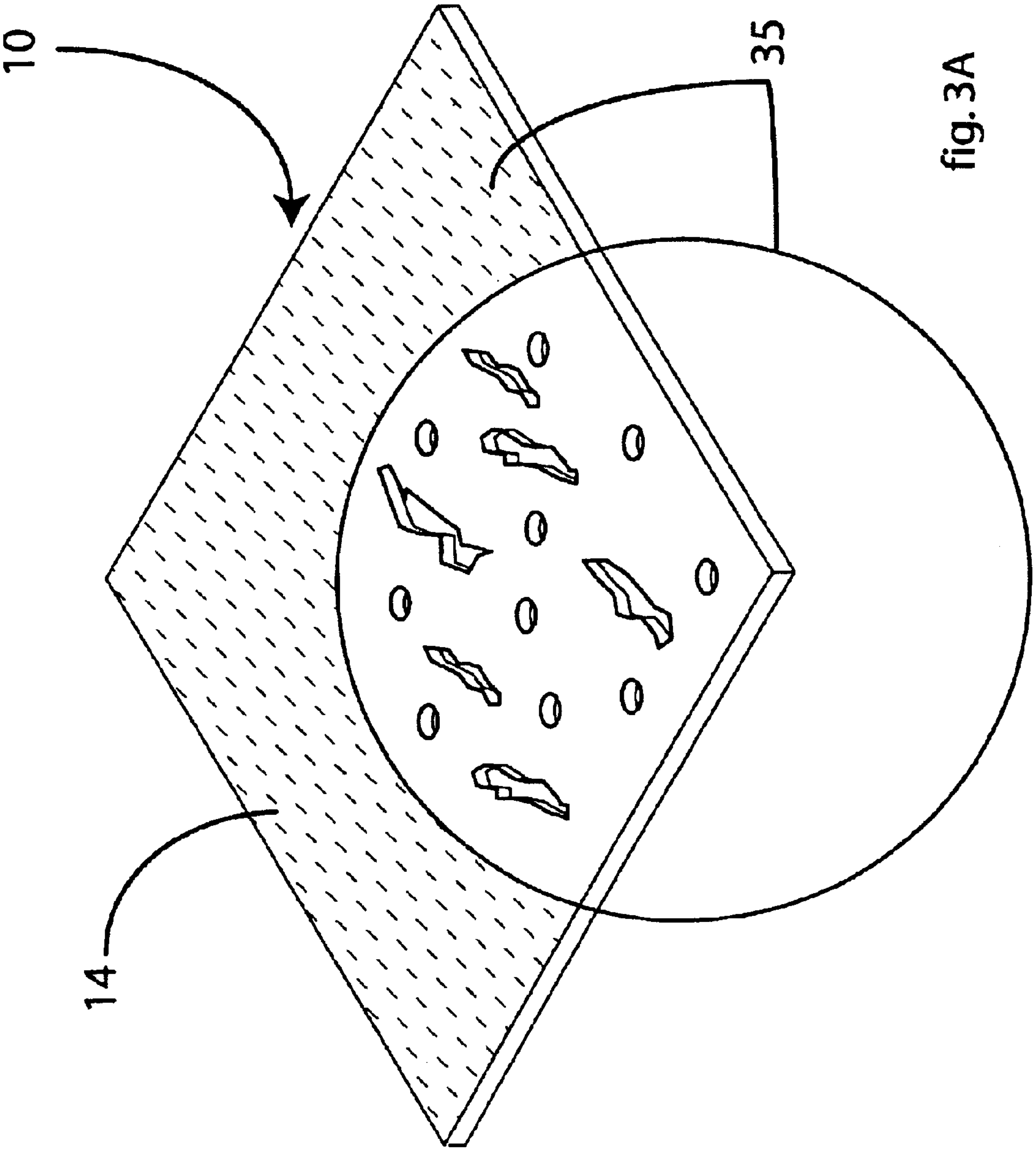
FIG. 3A shows a perforated/fissured diaphragm front surface.

FIG. 3A is an exemplary textured finish obtained by producing patterned perforations and indentations 35 over the diaphragm surface 14 of the planar loudspeaker 10.

Preferably, the outer surface (also referred as, the front surface 14) of the diaphragm 10 is configured to resemble the surrounding acoustic ceiling tiles. Such resemblance to a ceiling tile may embody a perforated, fissured or geometric pattern, its surface texture, color, size and corresponding edge profile for interface with the suspension grid.

In various exemplary methods of manufacture, a blank diaphragm with a substantially solid and uniform front surface is subjected to a secondary operation. Such operation produces a series of perforations and/or indentations in the form of holes and/or grooves, which are intended to imitate the perforated and/or fissured patterns generally found on commercial ceiling tiles. The exemplary methods to achieve such surface condition encompass a fixture in which the planar loudspeaker diaphragm is fixed with its exposed surface in an upwards position.

One approach is to place the fixture on a guided conveyor moving at particular speed and advances under a cylindrical barrel that rolls around its axis, whereas the barrel contains the reversed pattern over its surface. When the barrel surface becomes in contact with the diaphragm it transfers its pattern to the diaphragm surface, ultimately in the form of holes and/or grooves. Such pattern may be detachably fastened to the barrel surface and can be interchangeable, allowing for various designs to be used in the same equipment, as well as facilitating eventual repair. In addition, each pattern design can be made of a plurality of smaller components placed one against each other, but ultimately providing the same result as if it was a single component.

In another approach, the fixture is placed under an embossing press containing a plate. Such plate carries the reverse pattern over its surface. When the plate is actuated so as to move downwards and its surface becomes in positive contact with the diaphragm, it transfers its pattern to the diaphragm surface, ultimately in the form of holes and/or grooves. Obviously, a combination of a moving base and a smaller pressing plate may be desired to reduce equipment costs or to lessen the force applied to the diaphragm surface at a single time. As previously cited, such pattern or patterns may be detachably fastened to the pressing plate surface and are interchangeable, for the same reasons explained above.

The desired pattern may be placed on a template facing upwards, while the diaphragm is placed over this template with the exposed surface facing down. Subsequently, a plate located above the diaphragm moves down until it applies a certain amount of pressure over the rear of the diaphragm, which in turn transfers the pattern design into the diaphragm's front surface. The benefits of interchangeability or multiple pattern components hereby apply for the same reasons previously explained above.

Figures 4A, 4B:
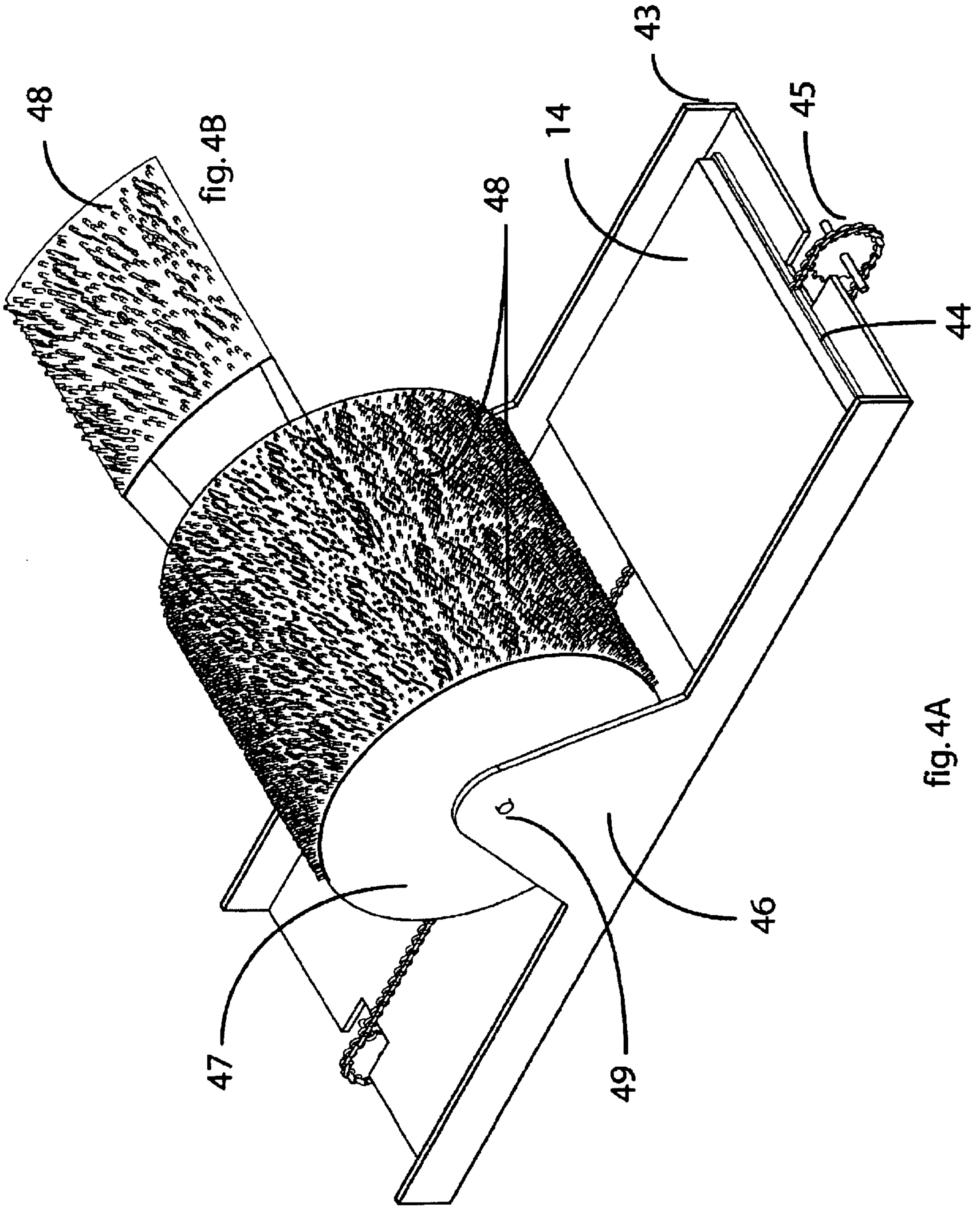
FIG. 4A is an isometric sketch showing the conveyor and barrel mechanism employed to create indentations and/or perforations over the exposed diaphragm surface.
FIG. 4B is an enlarged view of a section of the barrel surface, showing a typical reversed pattern used for replicating the texture of an acoustic tile. Such barrel surface may contain a plurality of parts as shown here, arranged in such a manner that resembles a whole unitary part.

The isometric sketch of FIG. 4A illustrates the mechanism employed to create a series of indentations and/or perforations over the exposed diaphragm surface 14 as explained in connection with FIG. 3A. Such mechanism includes a table 43 containing a fixture 44 in which a planar diaphragm is placed with the exposed surface 14 facing upwards. The table 43 contains a conveyor mechanism 45 that pushes the fixture 44 in one direction at a constant speed. The table 43 contains a pair of supporting arms 46 to support a barrel 47. Such barrel 47 rolls over its axis 49 and may be also motorized, and may also contain a plurality of reversed pattern designs 48 attached to its exterior face. When the fixture 44 advances, the diaphragm passes under the barrel 47 and the reversed pattern designs 48 are transferred to the diaphragm front surface 14. It is obvious for a person skilled in the art that the proper pattern transfer is obtained by precise control of any variables involved, such as conveyor speed, embossing pressure, etc., and which may vary depending on the loudspeaker diaphragm material and density. The barrel 47 can be interchangeable so other designs can be embossed over the diaphragm surface 14, or it is also possible to have a single barrel 47 to which a plurality of reversed pattern designs 48 can be temporarily attached. Such last alternative is preferred over the previous. FIG. 4B shows one of the multiple reversed pattern designs 48, which are fastened side by side to the barrel 47 in such a manner that it is not noticeable if the pattern is comprised of multiple pieces or just one.

Figure 5:
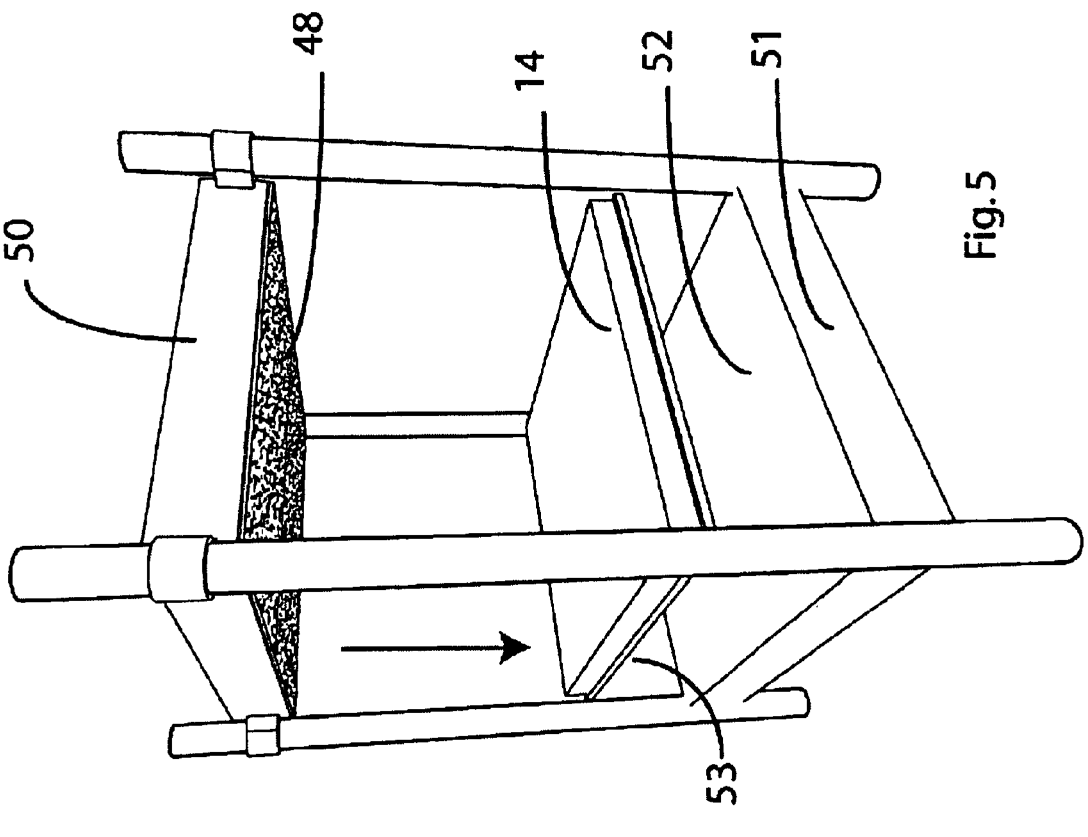
FIG. 5 is a perspective sketch showing the embossing press mechanism employed to create indentations and/or perforations over the exposed diaphragm surface.

An additional method, depicted in FIG. 5, is aimed at obtaining the same type of surface finish explained by the method illustrated in FIG. 4A, but in this embodiment the reversed pattern design 48 is attached over the face of an embossing press 50, and the diaphragm is set on a fixture 51 with the exposed surface 14 facing upwards. The top of the fixture 51 may have a surface 52 that replicates the contour of the rear surface of the diaphragm 53 (not shown) if such diaphragm has a molded contour on its rear, whereas the purpose of such is to assure equal distribution of pressure over the entire area when the pattern is transferred to the exposed surface of the diaphragm 14. When the embossing press 50—which contains the desired pattern—is actuated so as to move downwards and its surface becomes in positive contact with the diaphragm surface 14 it transfers its reverse pattern design 48 to the surface in the form of holes and/or grooves. As previously cited, such reversed pattern design 48 can be made of a plurality of parts that can be detachably fastened to the embossing plate surface and are interchangeable, for the same reasons explained above.

Figure 6:
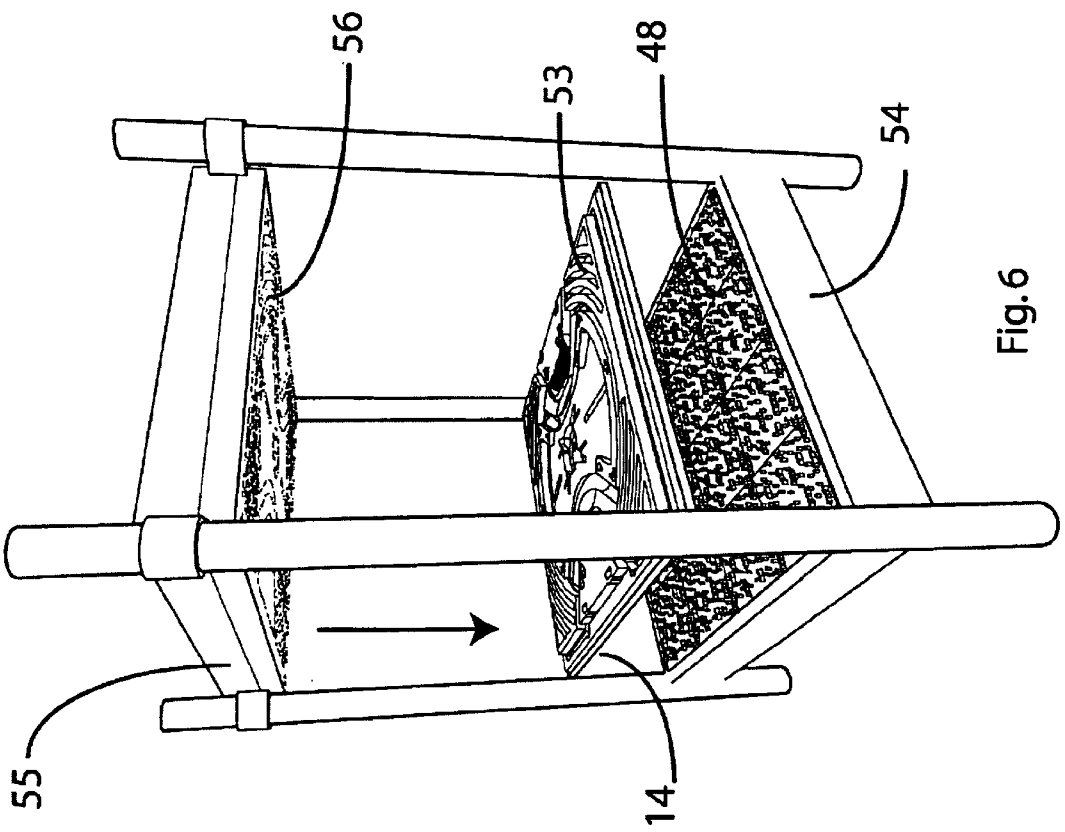
FIG. 6 is a perspective sketch showing a pattern template facing upwards, a speaker diaphragm front surface facing downwards and the pressing plate mechanism employed to create indentations and/or perforations over the exposed diaphragm surface.

As shown on FIG. 6, the desired reverse pattern design 48 may be placed on a fixture 54 facing upwards while the diaphragm is placed over this fixture 54 with the exposed surface 14 facing down (not shown). Subsequently, a plate 55 located above the diaphragm moves down until it applies a certain amount of pressure over the rear surface of the diaphragm 53, which in turn transfers the reverse pattern design 48 into the diaphragm's front surface 14. The benefits of interchangeability or multiple pattern components hereby apply for the same reasons and advantages previously explained above. The bottom of the plate 55 may have a surface 56 replicating the contour of the rear surface of the diaphragm 53 if such diaphragm has a molded contour on its rear. The purpose of such is to assure equal distribution of pressure over the entire area when the pattern is transferred to the exposed surface of the diaphragm 14. In reference to both embodiments as shown on FIG. 5 and FIG. 6, the process employed to engage or actuate the pressing mechanism against the diaphragm is not explained in detail since it is not considered of particular relevance, but may involve manual, electrical, hydraulic or other mechanisms.

2. Paste-Like Application of Textured Material

Figure 3B:
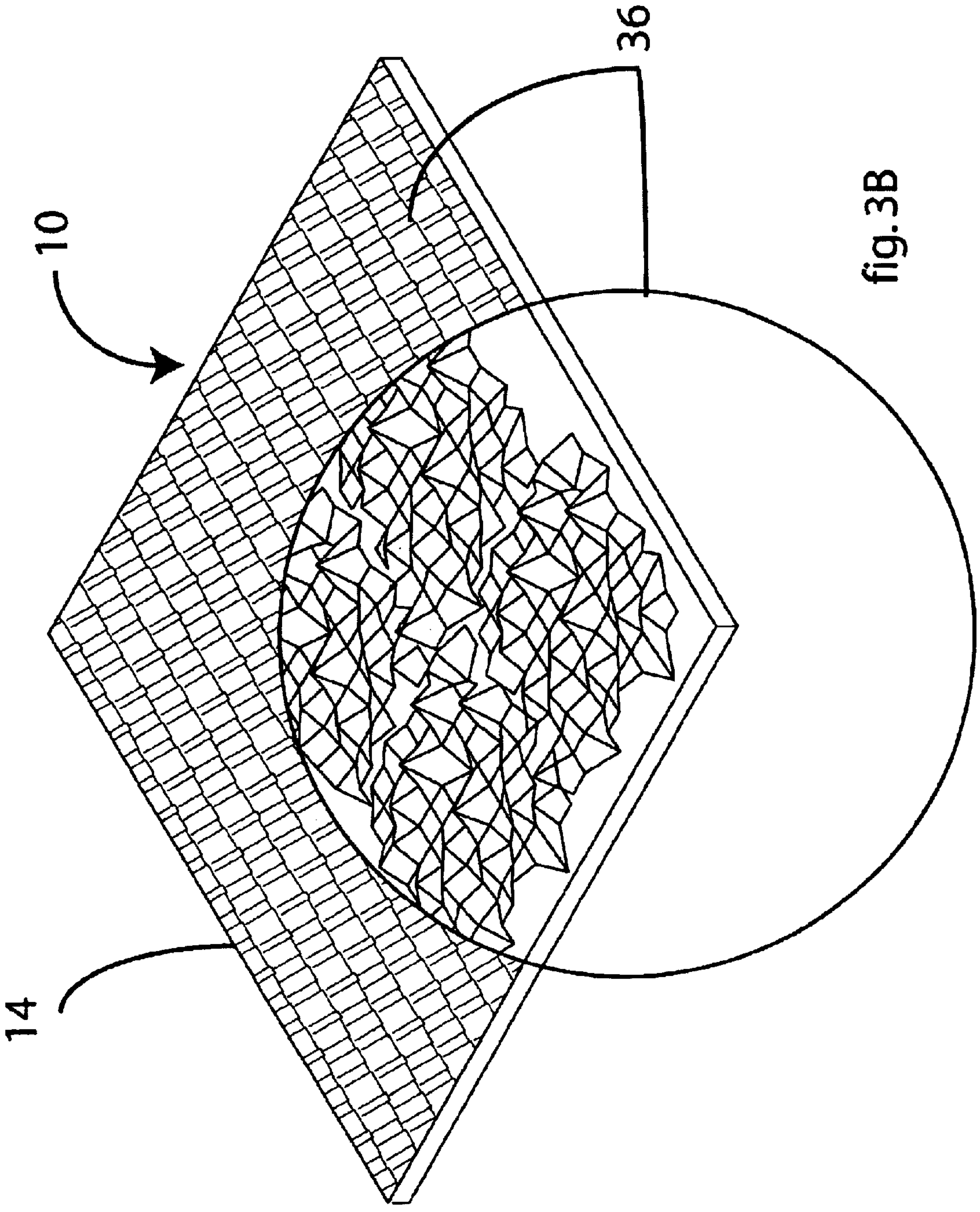
FIG. 3B shows a textured diaphragm front surface obtained by applying a paste-like substance.

With reference to FIG. 3B, a textured surface is obtained by applying a paste-like substance 36 over the diaphragm surface 14 of the planar loud speaker 10, whereas such substance is typically made of mineral wool, cellulose fiber and/or other granular materials and is applied with spray or spread over a surface and leveled while in a wet-mix stage. Such substance hardens once the water content evaporates, providing a textured three-dimensional appearance that resembles certain acoustic ceiling tiles. A matching color can be either obtained by adding pigmentation to the mixture or by spray or roller painting the hardened surface.

Figure 7:
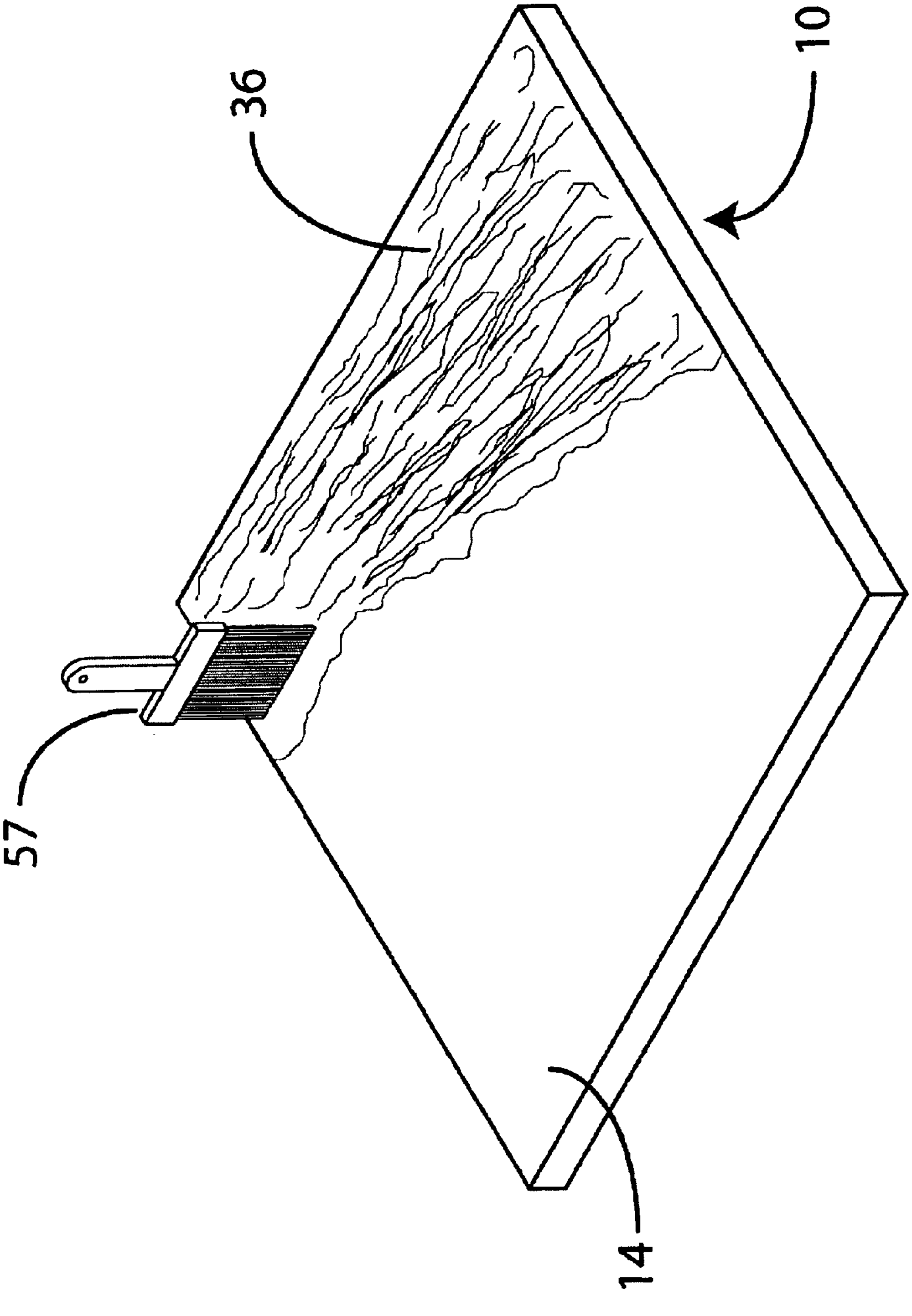
FIG. 7 is an isometric sketch showing the application of a paste-like substance in a wet-form state over the diaphragm front surface, to obtain a desired textured appearance.
Figure 8:
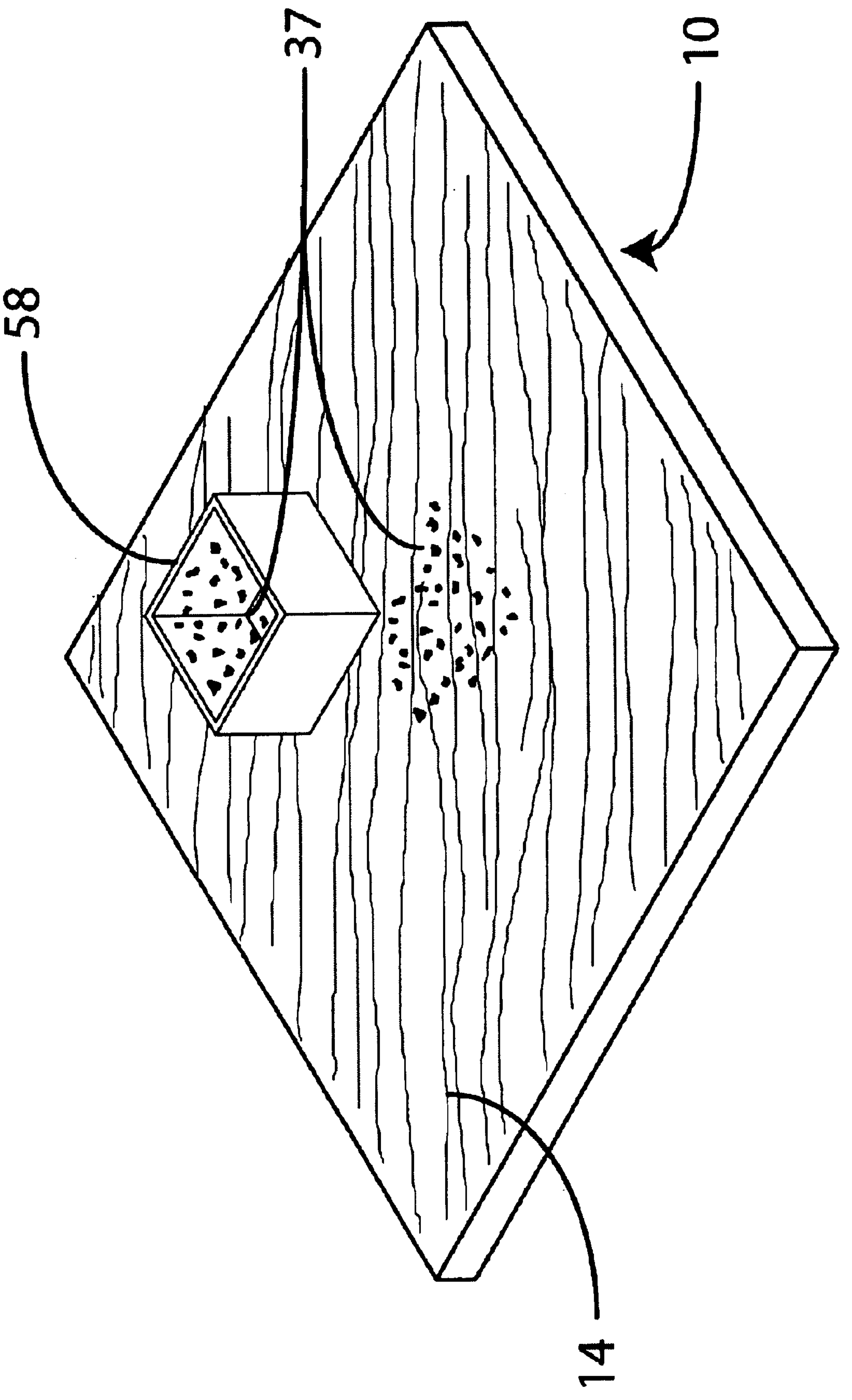
FIG. 8 is an isometric sketch showing the prior application of a water-based adhesive and subsequent dispersal of a powdery or fiber-like compound over the diaphragm front surface, to obtain a desired textured appearance.
Figure 9:
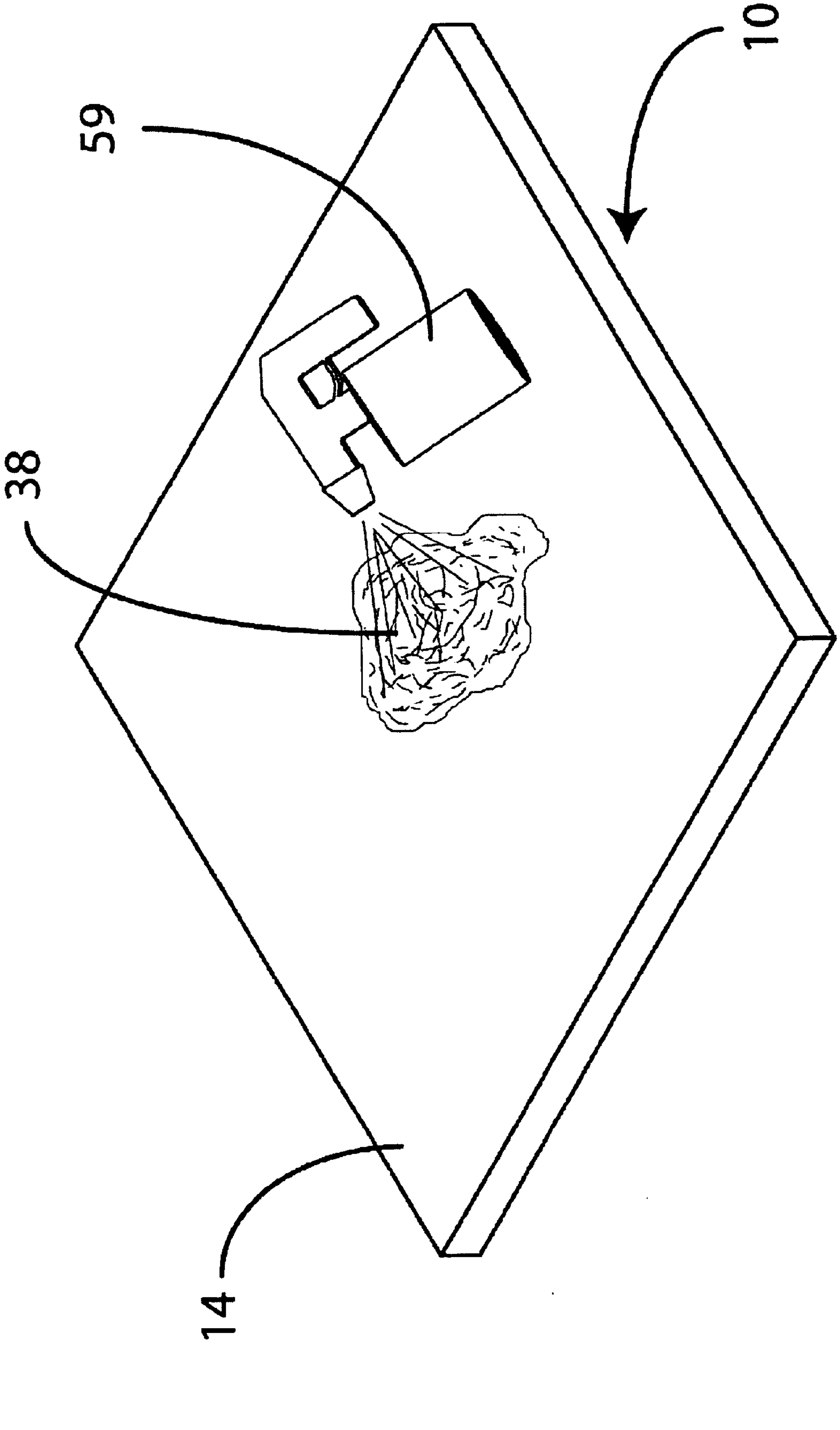
FIG. 9 is an isometric sketch showing the spray application of a solvent-based emulsion that etches the diaphragm front surface in order to obtain a desired textured appearance.

The application procedures depicted in FIGS. 7 through 9 illustrate an exemplary process used to obtain certain textured finishes over the exposed diaphragm surface 14. More particularly, FIG. 7 shows paste-like substance 36, in a wet-form state, applied with a hand tool 57—such as a spatula or trowel—directly over the front surface 14 of a planar diaphragm 10. Next, as shown in FIG. 8, a container 58 used for subsequent dispersal of a powdery or fiber-like compound 37 over the front surface 14 of a planar diaphragm 10 while still wet.

3. Painted Application of Textured Material

A third method to provide a textured diaphragm comprises a flat diaphragm with a substantially solid and uniform front surface to which a water-based adhesive is sprayed-on or applied by roller or brush over the front surface. After the application of such adhesive and before the adhesive dries, a powdery or fiber-like compound is evenly dispersed over the entire front surface of the diaphragm, becoming permanently adhered to the contact surface. Such powdery compound can be a granular, pebbled-like powder substance, crushed mineral rock, sand, perlite, gypsum or other inorganic materials, as well as other lightweight artificial products. Such fiber-like compound may be chopped glass fibers or mineral fiber strands. The combination of compound size and density of application establish the desired surface texture. Once the adhesive is fully dried, the excess compound that did not adhere to the diaphragm surface is removed, and subsequently the new textured surface is painted to match the desired color.

Figure 3C:
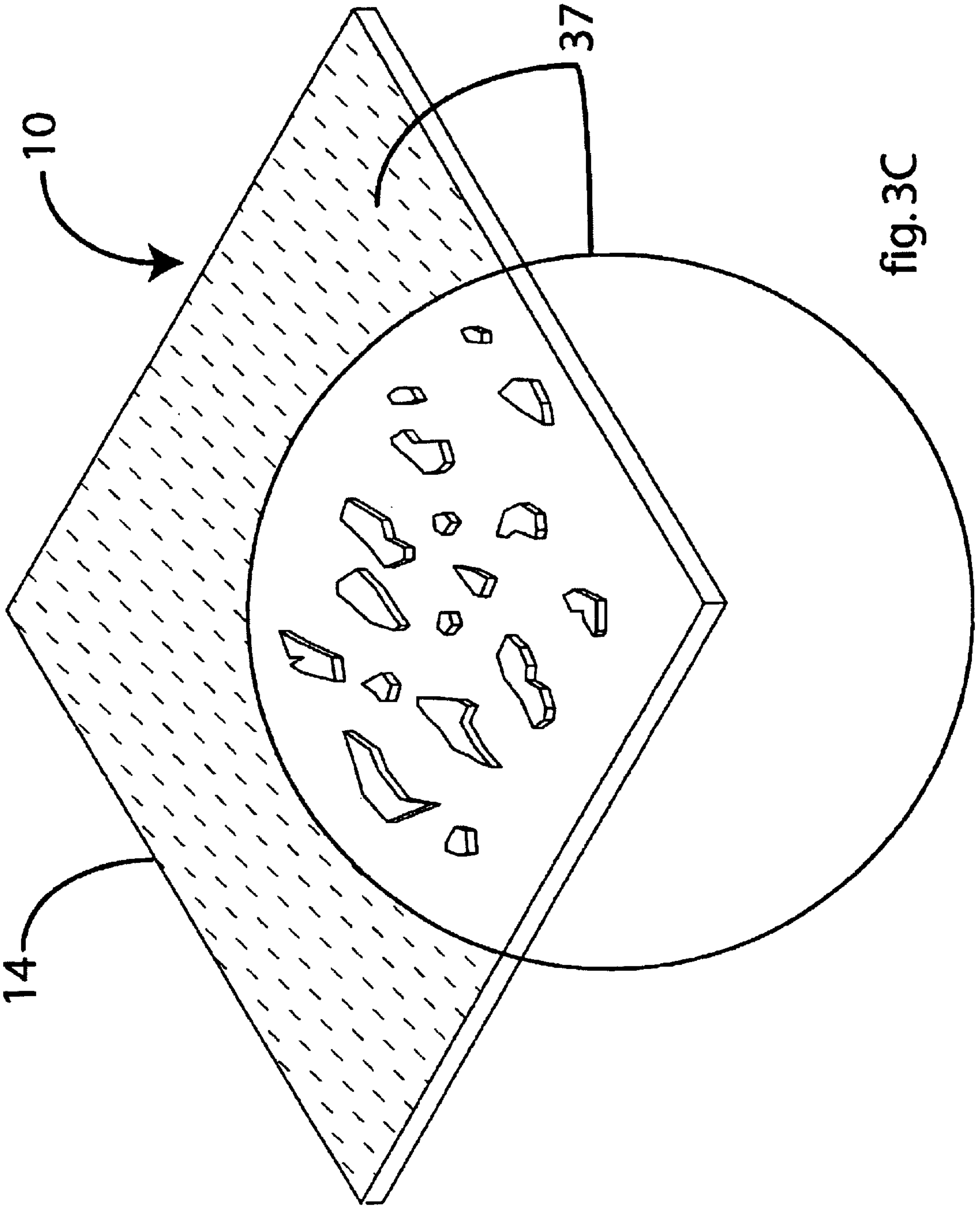
FIG. 3C shows a textured diaphragm front surface obtained by applying powdery or fiber-like compounds.

Additionally, and as shown here in FIG. 3C a random-textured finish can be obtained by applying a powdery or fiber-like compound 37 over the diaphragm surface 14 of the planar loudspeaker 10. Prior to the application of such compound, a water-based adhesive is sprayed-on or applied by roller or brush over the front surface of the diaphragm 14 and subsequently the compound is dispersed over the entire diaphragm. When the compound becomes in contact with the wet adhesive applied over the surface it becomes cohesive, and eventually adhered permanently, once the adhesive dries. Any remaining compound not entirely adhered to the surface may be subsequently removed by shaking or air-blown before the application of a coat of paint, which not only serves to match the desired color but also to seal and protect the textured surface.

As previously explained, the compound 37 can be granular or pebbled-like powder, crushed minerals or other inorganic materials, chopped glass fibers, mineral fiber strands or lightweight artificial products. The desired texture can be obtained by combining more than one of the materials, by increasing or decreasing the density of application of the compound over the surface—either by varying the size of the screen or mesh of the compound application container or by multiple passes over the surface—or by using different fiber or granule sizes.

4. Etching Solvent

A fourth method to obtain a textured three-dimensional appearance over the exposed surface of the loudspeaker's diaphragm is to spray a solvent-based emulsion that etches the surface to be treated and consequently takes on the appearance of other textured materials. Once the desired texture is attained, which can be controlled by the mix-ratio between the etching solvent and a neutral carrier, the surface can be finished with latex-based paint to obtain the desired color.

Figure 3D:
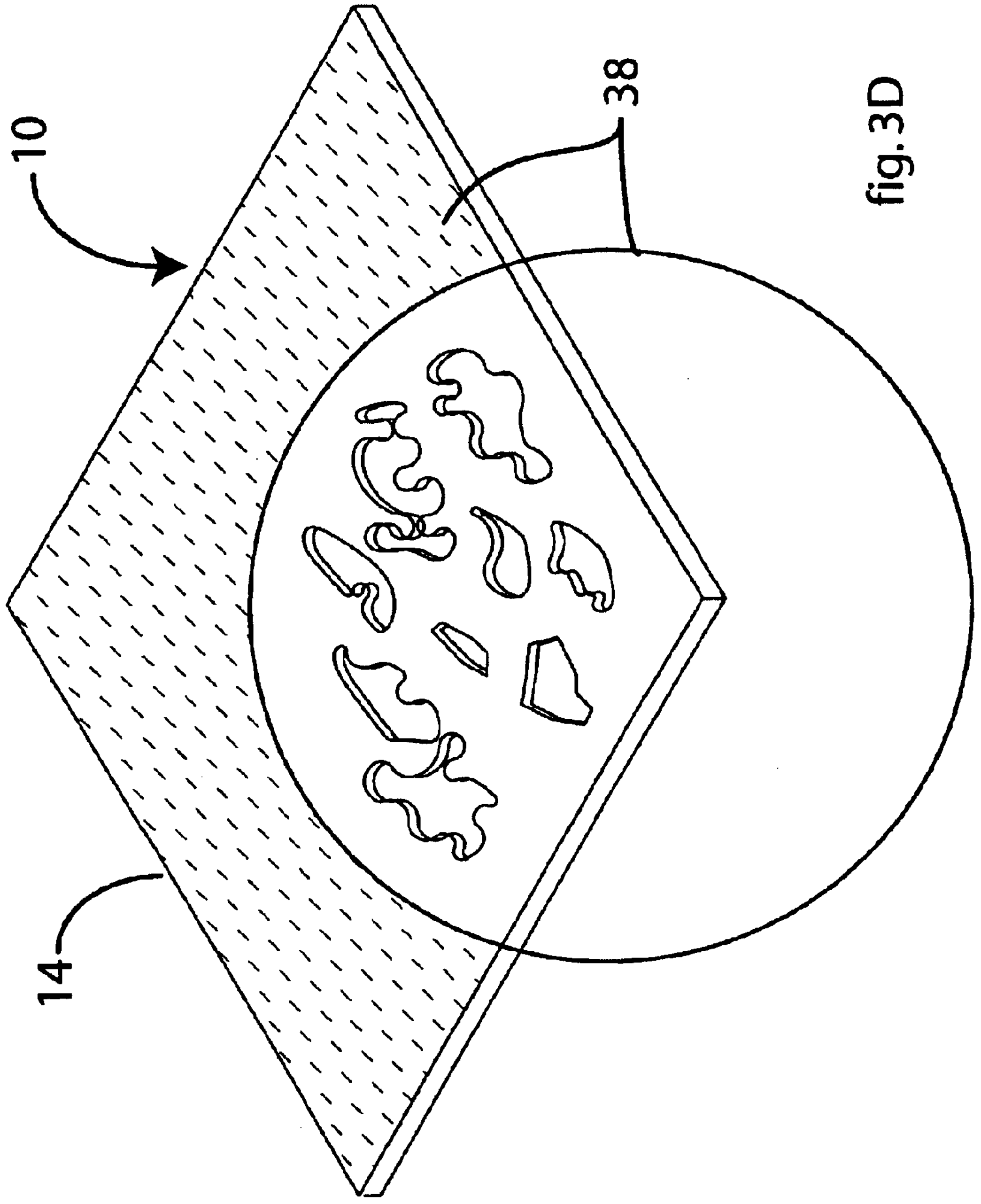
FIG. 3D shows a textured diaphragm front surface obtained by applying an etching solvent.

Referring to FIG. 3D, a random-textured finish is here obtained by applying an etching solvent-based emulsion 38 over the diaphragm surface 14 of the planar loudspeaker 10. The type of solvent applied is dependent on the diaphragm material employed and the desired texture. Examples of solvents that can be used to erode or etch an expanded cellular material such as polystyrene or certain closed-cell polymers are toluene and MEK (methyl-ethyl-ketone). In order to control the etching process, a dual-nozzle spray gun can be used to spray a mix of solvent and water—or other neutral liquid—over the diaphragm surface. The mix-ratio between both liquids and application distance from the surface determine the severity or depth of the etching. FIG. 9 shows the application of a solvent-based etching emulsion 38 with a spray gun 59, over the front surface 14 of a planar diaphragm 10.

5. Machine Etching

A fifth method described to obtain a three-dimensional appearance over the exposed surface of the loudspeaker's diaphragm comprises a fixture that holds the diaphragm in place with its exposed surface in an upwards position, while a computer-controlled routing machine with interchangeable tooling pieces is supported by a gantry over the fixture and moves along the "x" and "y" axis, and where such routing machine can also move over the "z" axis allowing for precise, elaborate geometric designs to be made over the diaphragm's surface.

Figure 3E:
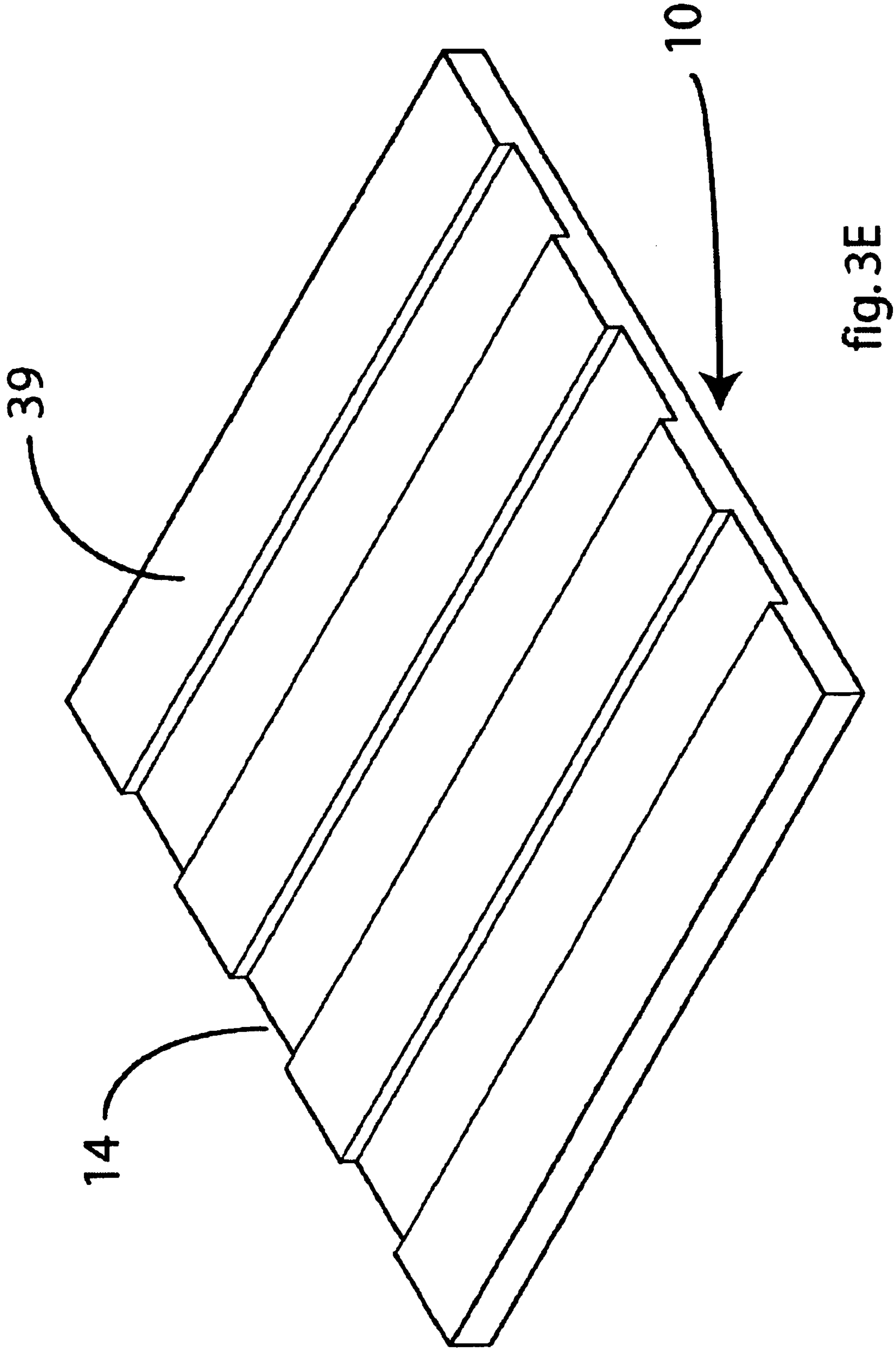
FIG. 3E shows a geometrical pattern routed over the diaphragm front surface.
Figure 10:
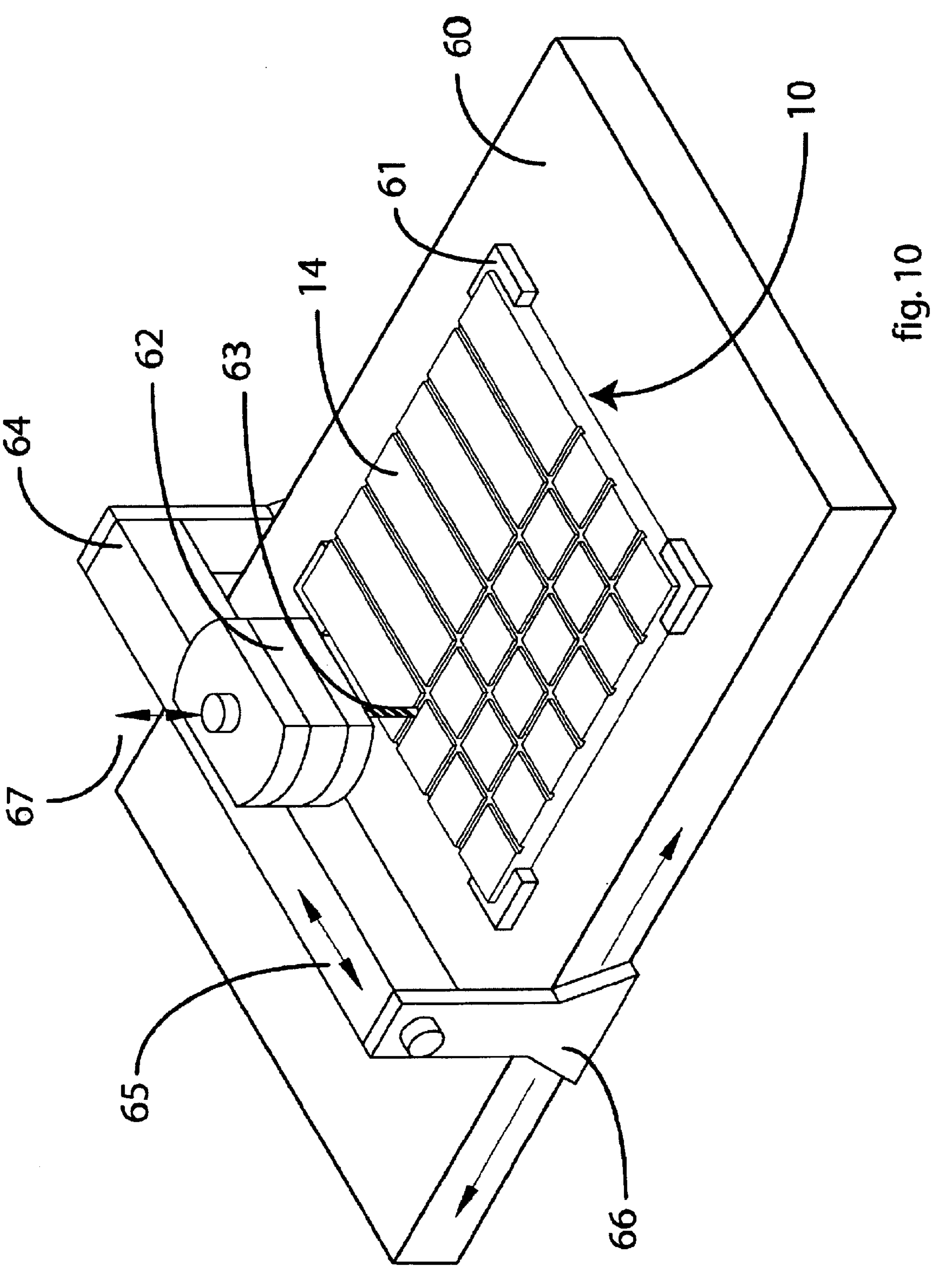
FIG. 10 is a perspective sketch showing a planar diaphragm set on a fixture and a computer-controlled routing machine with interchangeable tooling pieces mounted on a gantry, whereas such setting is intended to obtain the desired geometric designs over the diaphragm front surface.
Figure 11:
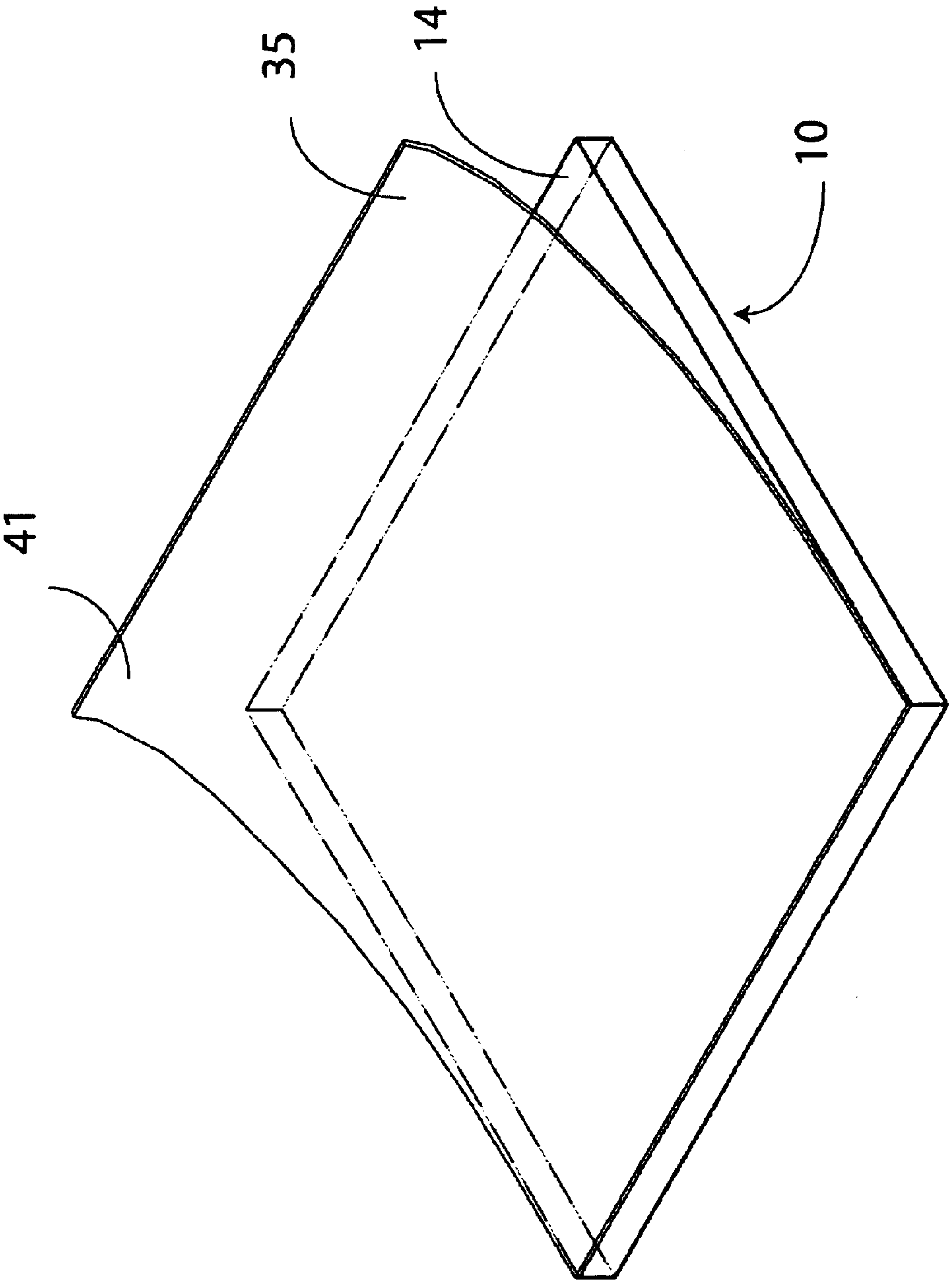
FIG. 11 is an isometric sketch showing the front surface of a planar diaphragm with an adhesive already applied and the subsequent application of a thin sheet of polymeric material over the front; whereas such sheet been previously perforated and/or indented or routed by one of the process previously explained.

An alternative procedure adopted to create a specific geometric design over the front surface 14 of a planar diaphragm 10 as shown in FIG. 10—or as previously shown on FIGS. 3E/3F—involves a table 60 containing a fixture 61 that holds the planar diaphragm 10 with the exposed front surface 14 facing upwards, and where a computer-controlled routing machine 62 with interchangeable tooling pieces 63 is mounted on a gantry 64 over the part to be routed, and where such gantry 64 moves along the "x" axis 65 and "y" axis 66, and where such routing 62 machine can also move over the "z" axis 67 allowing for precise, elaborate geometric designs to be made over the diaphragm surface 14. Within the scope of this embodiment, such geometric design can be implemented in the same manner herein explained, but instead, on a thin sheet of polymer material 41 which is further adhesively and permanently applied over the diaphragm surface 14. Examples of such geometric designs can be found on FIG. 3E and FIG. 3F, under numerals 39 and 40, respectively.

Figure 3F:
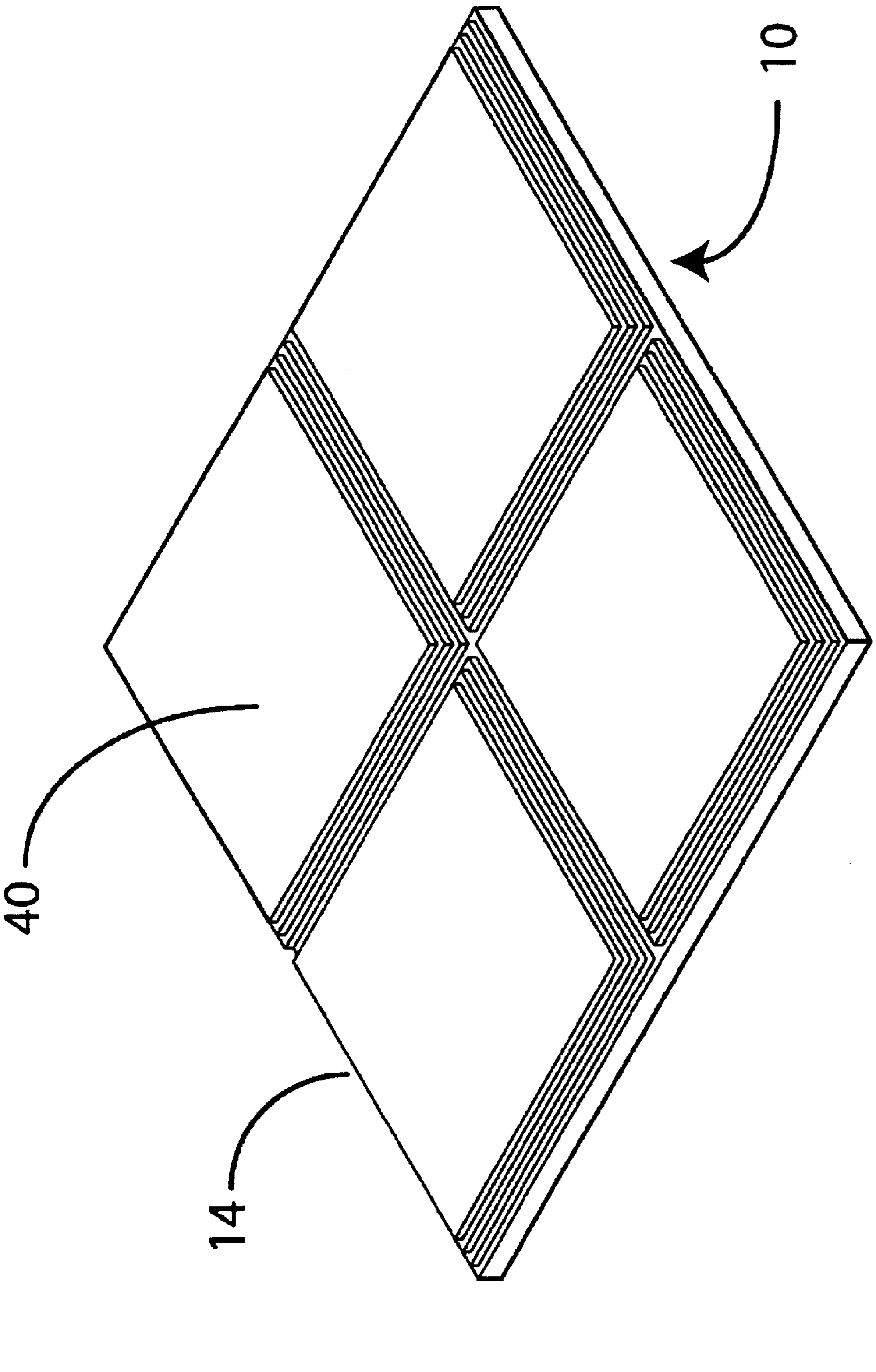
FIG. 3F shows an alternative geometrical pattern routed over the diaphragm front surface.

The surface treatment example shown on FIG. 3E is a programmed, geometrical surface finish design, obtained by computer-control routing 39 over the diaphragm surface 14 of the planar loudspeaker 10. Basically, the equipment used to obtain this type of three-dimensional appearance comprises a fixture that holds the diaphragm in place with the exposed surface 14 in an upwards position, and a computer-controlled routing machine. FIG. 3F is an alternative geometrical surface finish 40 obtained as explained on FIG. 3E.

6. Secondary Sheets

In yet another embodiment, a thin sheet of polymeric cellular material such as expandable polystyrene is applied of over the exposed surface of the diaphragm. In this particular embodiment, such sheet has been previously perforated and/or indented or routed, by one of the process previously explained (refer to the first method) and thereafter is adhesively applied over the flat, untreated front surface of the speaker's diaphragm. Although the process to perforate, indent or route the material surface and the ending result may be similar, this approach allows for an alternative method that may be more suitable for particular manufacturing procedures, and with no substantial detriment of sound reproduction.

Figure 12:
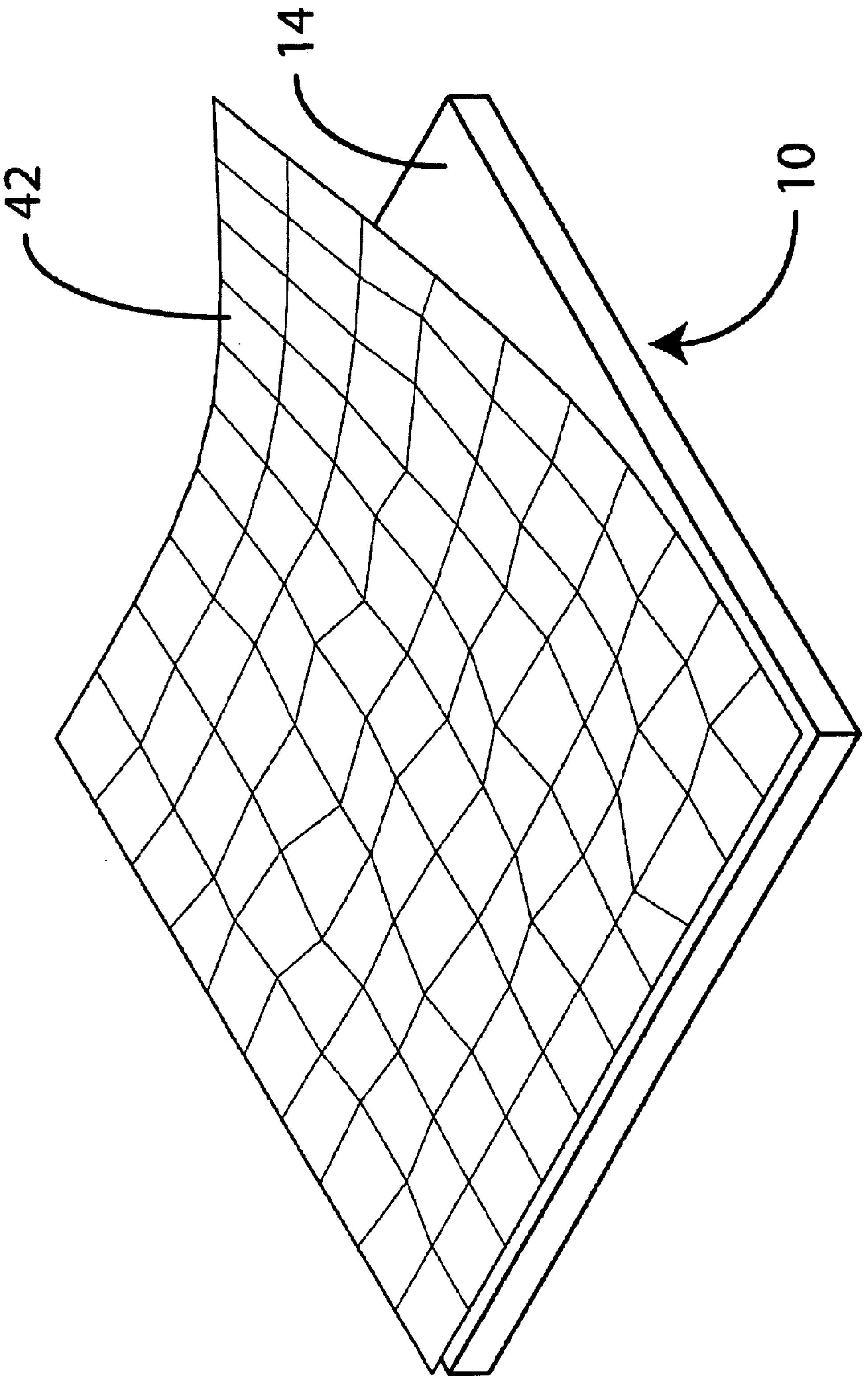
FIG. 12 is an isometric sketch showing the front surface of a planar diaphragm with an adhesive already applied and the subsequent application of a non-woven absorptive fabric over the front.
Figure 13A:
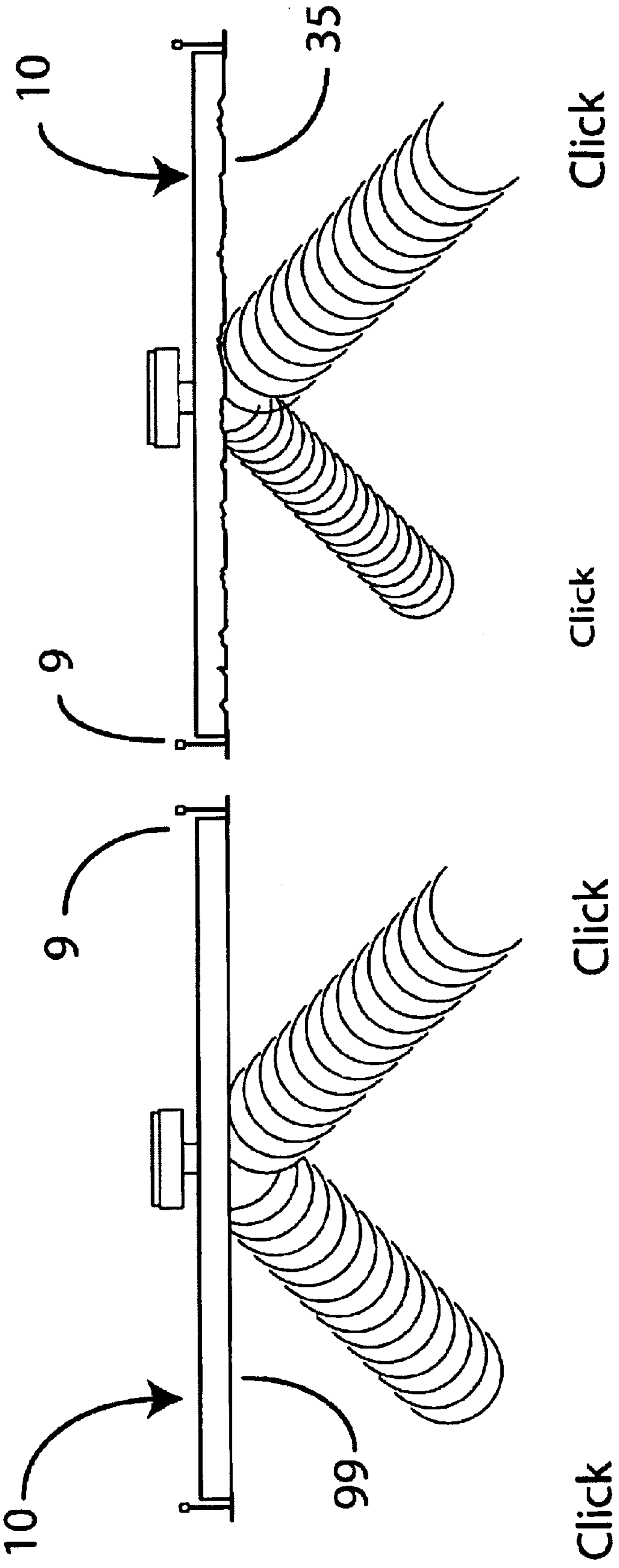
FIG. 13A is an illustrative drawing showing the acoustic benefit of a textured or perforated diaphragm surface in contrast to a diaphragm that has been painted or screen-printed.
Figure 13B:
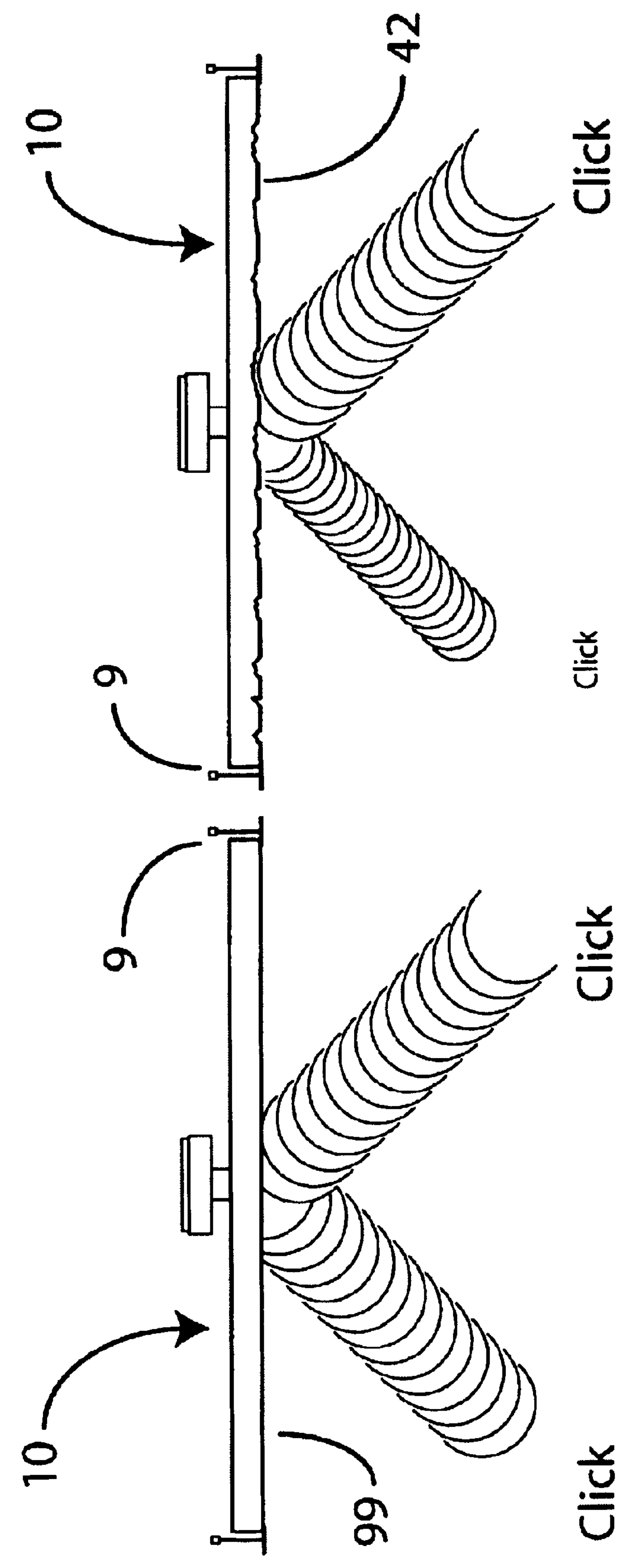
FIG. 13B is an illustrative drawing showing the acoustic benefit of a diaphragm surface with an absorptive acoustic fabric in contrast to a diaphragm that has been painted or screen-printed.

Additionally, a surface treatment for a planar loudspeaker is depicted in FIG. 12, whereas the front surface 14 of a planar loudspeaker 10 is covered with a water-based, vinyl-type adhesive and subsequently a non-woven absorptive fabric 42 is applied and stretched over the front surface 14 of the diaphragm, whereas such fabric is not only intended to be applied for decorative purposes (i.e., to replicate the surrounding acoustic tiles in a suspended ceiling), but for environmental acoustic control as well, including better noise reduction coefficients and improved speech articulation in office environments. In general, any of the three-dimensional surface treatments or methods explained renders a planar diaphragm loudspeaker 10 with a front surface 14 that is less reflective than a painted or paper-faced planar loudspeaker front surface. Such three-dimensional surface is considered an advantage over prior art planar diaphragm loudspeakers since its textured or perforated surface helps reduce environmental noise reverberation and improves workspace effectiveness in open plan offices. The latter is represented on FIG. 13A, which shows a "click" noise aimed at the surface of a planar diaphragm loudspeaker 10 having a painted or screen-printed surface 99 (left image) and a planar diaphragm loudspeaker 10 having a perforated/indented surface 35 (right image), both similarly installed in a suspended ceiling grid 9. As illustrated on the left image, the noise bounces off the painted surface 99 with about the same intensity, while the reflected sound is substantially reduced after it reaches the perforated/indented surface 35 (right image). An even more contrasting difference can be observed, as shown in FIG. 13B, when comparing a planar diaphragm loudspeaker 10 having a painted or screen-printed surface 99 (left image) to a planar diaphragm loudspeaker 10 having a non-woven acoustic fabric surface 42 (right image), both similarly installed in a suspended ceiling grid 9.

It also has to be noted that any of above-explained three-dimensional surface treatments renders a surface that is less reflective than a painted or paper-faced planar loudspeaker front surface. Such three-dimensional surface reduces environmental noise reverberation and improves workspace effectiveness in open plan offices. Therefore, it can be said that an outcome from the basic objective of this invention is also a contributing factor to the acoustical properties of a room, when compared to prior planar loudspeaker art.

Figure 3G:
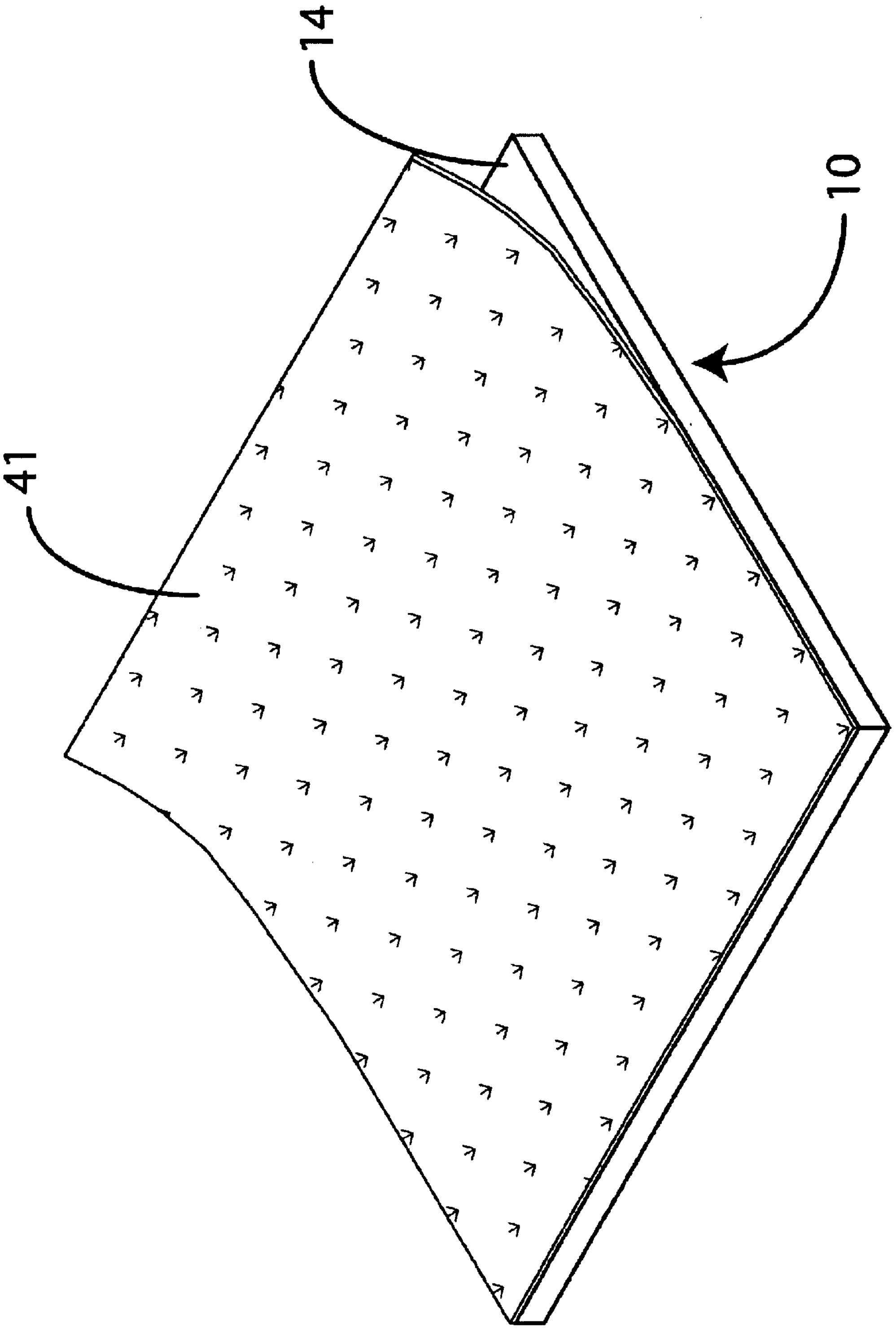
FIG. 3G shows an additional sheet of pre-textured polymer material adhesively applied over the diaphragm front surface.

FIG. 3G shows an additional sheet of polymer material 41 being adhesively applied over the diaphragm surface 14 of the planar loudspeaker 10, whereas the polymer sheet 41 has been pre-textured by one of methods recently cited, such as patterned perforations and indentations 35, solvent-etched 38, or with a geometrically routed pattern design 39–40.

Figure 3H:
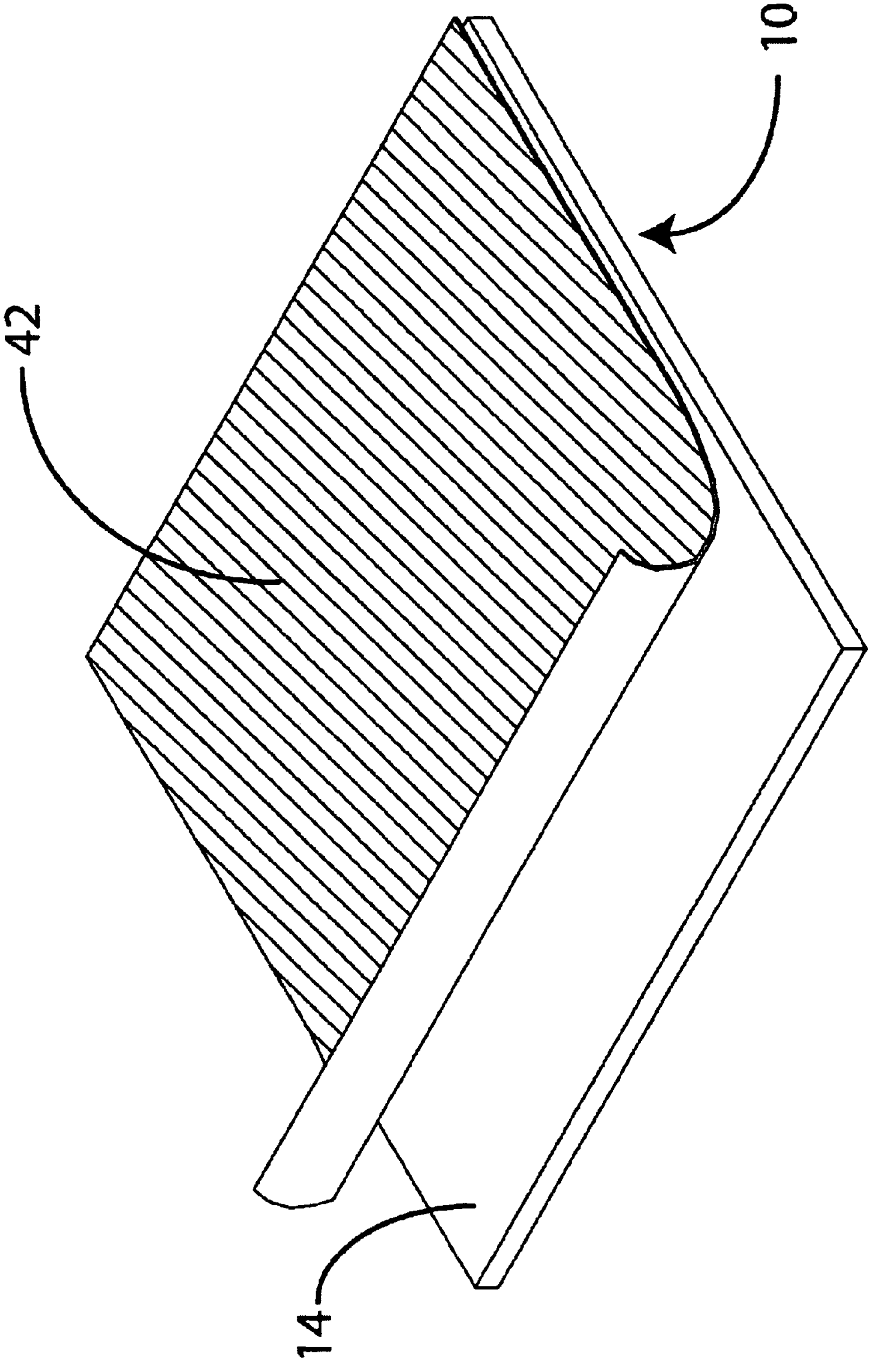
FIG. 3H shows an acoustic absorptive fabric adhesively applied over the diaphragm front surface.

Finally, FIG. 3H illustrates the application of an acoustic, non-woven absorptive fabric 42, adhesively applied over the diaphragm surface 14 of the planar loudspeaker 10, whereas such fabric not only serves for decorative purposes—especially when the surround ceiling tiles have a fabric-faced finish—but at the same time it improves the acoustic properties of the room where the loudspeaker is installed, due to its sound absorption qualities.

Yet another method hereby characterized not only renders an aesthetic advantage over prior art but an acoustic solution as well, in which a non-woven, sound absorptive fabric adhesively applied over the exposed surface of the diaphragm. Although the concept of applying fabric over the diaphragm's surface has been contemplated in the prior art (e.g., U.S. Pat. Nos. 3,596,733 and 3,779,336) such fabric was intended to be used for decorative purposes only. The current alternative defines the use of fabric to aesthetically match the surrounding ceiling tiles, while at the same time the non-woven, sound absorptive fabric applied over the diaphragm's exposed surface improves the acoustic properties of the room where the loudspeaker is installed. Such improvement is manifest as a better noise reduction coefficient and speech articulation in open plan offices.

Essentially, the above-explained methods are advantageous for many reasons. For example, a three-dimensional diaphragm surface that accurately replicates the surrounding ceiling tiles, regardless of the method hereby described to obtain such appearance, is more desirable than a painted or screen-printed surface. Furthermore, applying the three-dimensional surface treatment directly over a plain diaphragm simplifies the manufacture and stocking of parts, since a single, plain diaphragm can be converted into a variety of available patterns or textures on an "as-needed" basis.

B. Loudspeaker Shroud

Figure 14A:
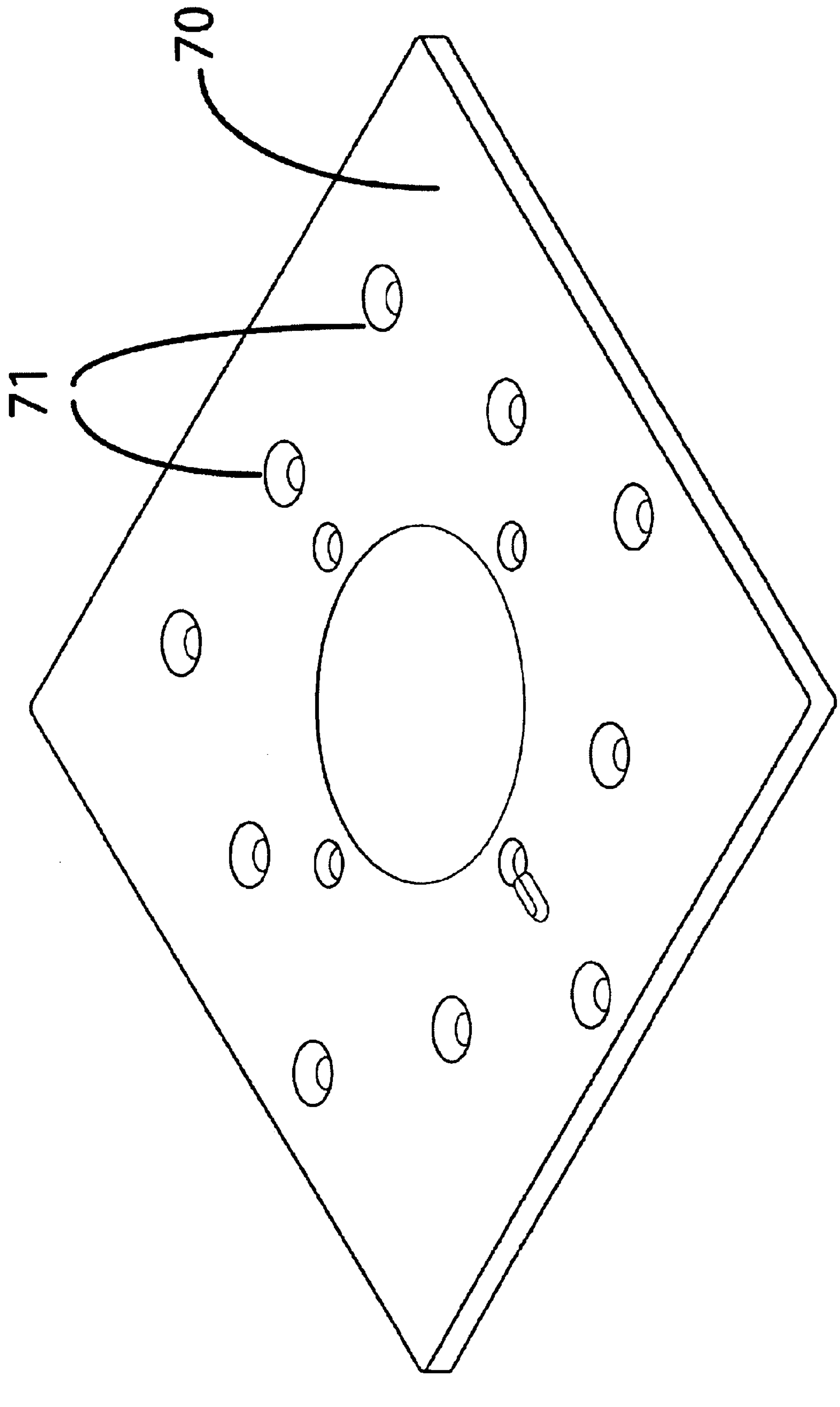
FIG. 14A is an isometric drawing of the metallic shroud that covers the rear perimeter of the loudspeaker, depicting the indentations required to allow the loudspeaker to be installed flush-mounted or at pre-determined tegular-drop settings.
Figure 14B:
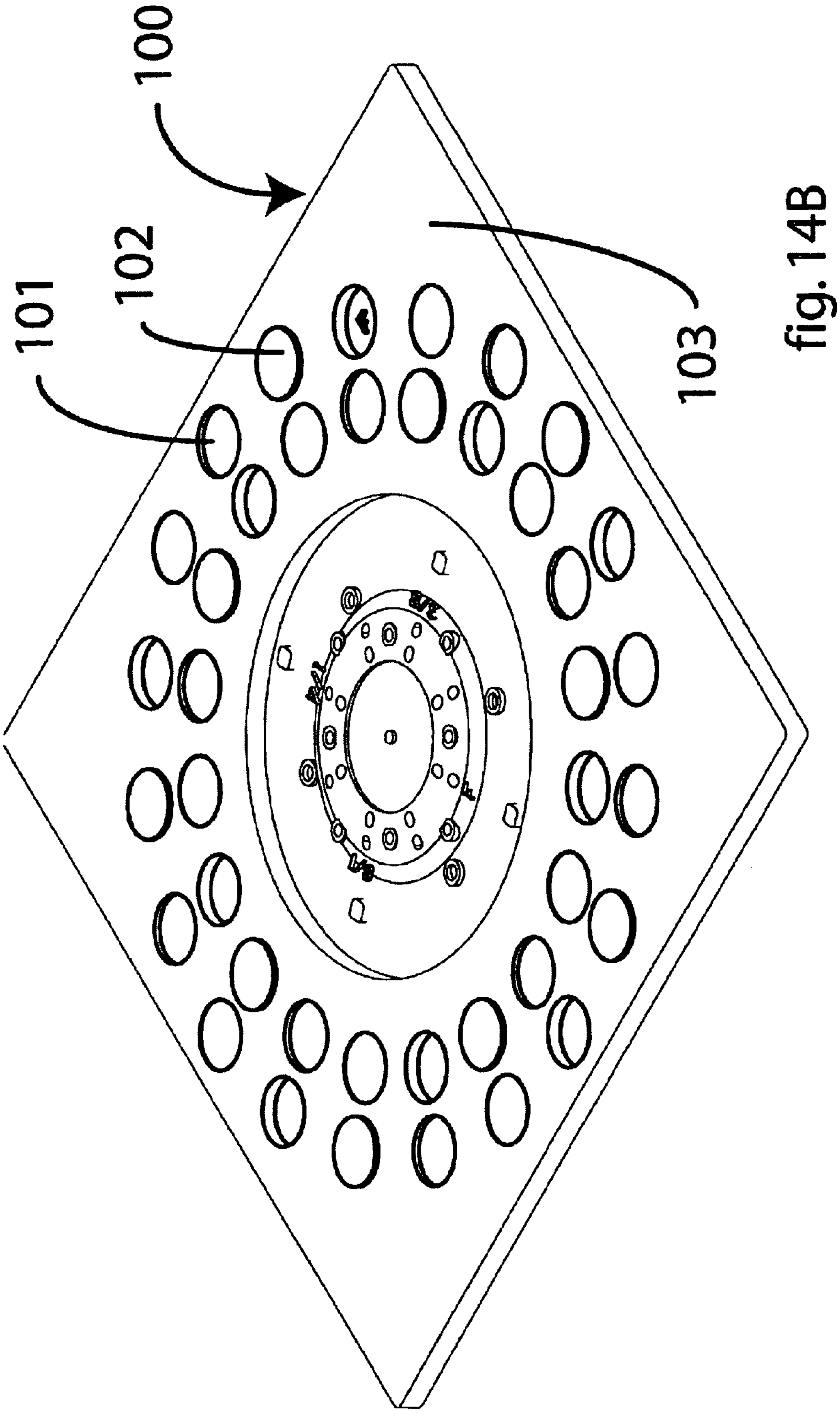
FIG. 14B is an isometric drawing of a loudspeaker diaphragm, depicting the recesses or protuberances that allow the loudspeaker to be assembled for use in a flush-mounted fashion or at pre-determined tegular-drop settings.

In reference to FIG. 14A and FIG. 14B, a loudspeaker diaphragm, hereafter referenced as numeral 100 (FIG. 14B), and a metallic shroud 70 is shown. The shroud 70 covers the rear perimeter of the diaphragm 100, as shown in FIG. 14A, and defines a series of indentations 71. The indentations facilitate installation of the loudspeaker diaphragm 100 onto a flush-mounted position or at pre-determined tegular-drop settings, as further explained. The recesses 101 or protuberances 102 molded onto the rear surface 103 of the diaphragm 100—as shown in FIG. 14B—are in direct relationship with the indentations 71 found over the shroud 70.

Installation of the loudspeaker is in compliance with the requirements of the National Electrical Code (NEC) to protect building occupants from electrical shock in case of building collapse, among other things, and the provisions of the National Fire Protection Association (NFPA) Standard 90-A and in compliance with UL Standard 2043. Without further explanation or details as to such requirements and/or standards—which are hereby mentioned just for reference—it must be noted that ceiling loudspeakers may require a metallic enclosure behind the ceiling surface to be in compliance with local building, electrical and/or fire codes. A planar speaker installed in a ceiling that is part of an air-handling system may or may not need an enclosure depending on the materials employed to manufacture such product, and the product of combustion (flammability, smoke and heat release) of such materials.

Figure 15A:
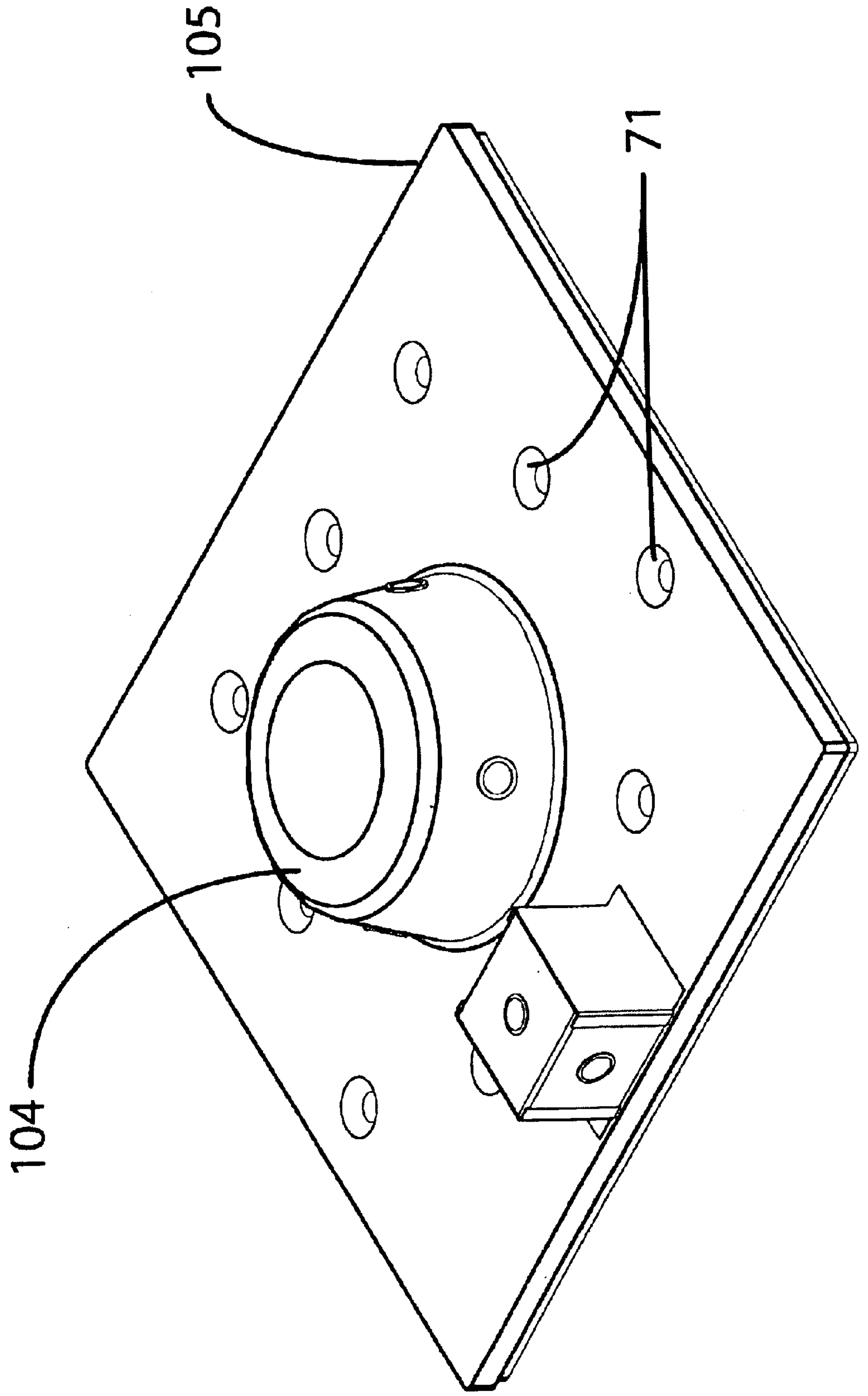
FIG. 15A is an isometric sketch showing the integrated enclosure and shroud that covers the rear of the loudspeaker, also with the indentations required to allow the loudspeaker to be installed flush-mounted or at pre-determined tegular-drop settings.

Such indentations 71 are arranged in two pentagons, being one of them of a smaller radius. The loudspeaker diaphragm 100 has a set of indentations 101 and protuberances 102 that match the position of the indentations 71 formed in the shroud 70. The latter are arranged in an array with 72 degrees angular offset. To achieve the desired flush or tegular-drop effect once a speaker is installed in a ceiling, both components—diaphragm 100 and shroud 70—need to be specifically oriented one respect to the other so as to match the proper combination of indentations. Rotating the diaphragm 100 at 90° intervals allows for multiple settings, as further explained. On a first embodiment, an integrated enclosure 104 and shroud 105 covers the entire rear of the loudspeaker—as shown on FIG. 15A—and also contains the indentations 71 required to allow the loudspeaker to be further installed flush-mounted or at pre-determined tegular-drop settings.

Figure 15B:
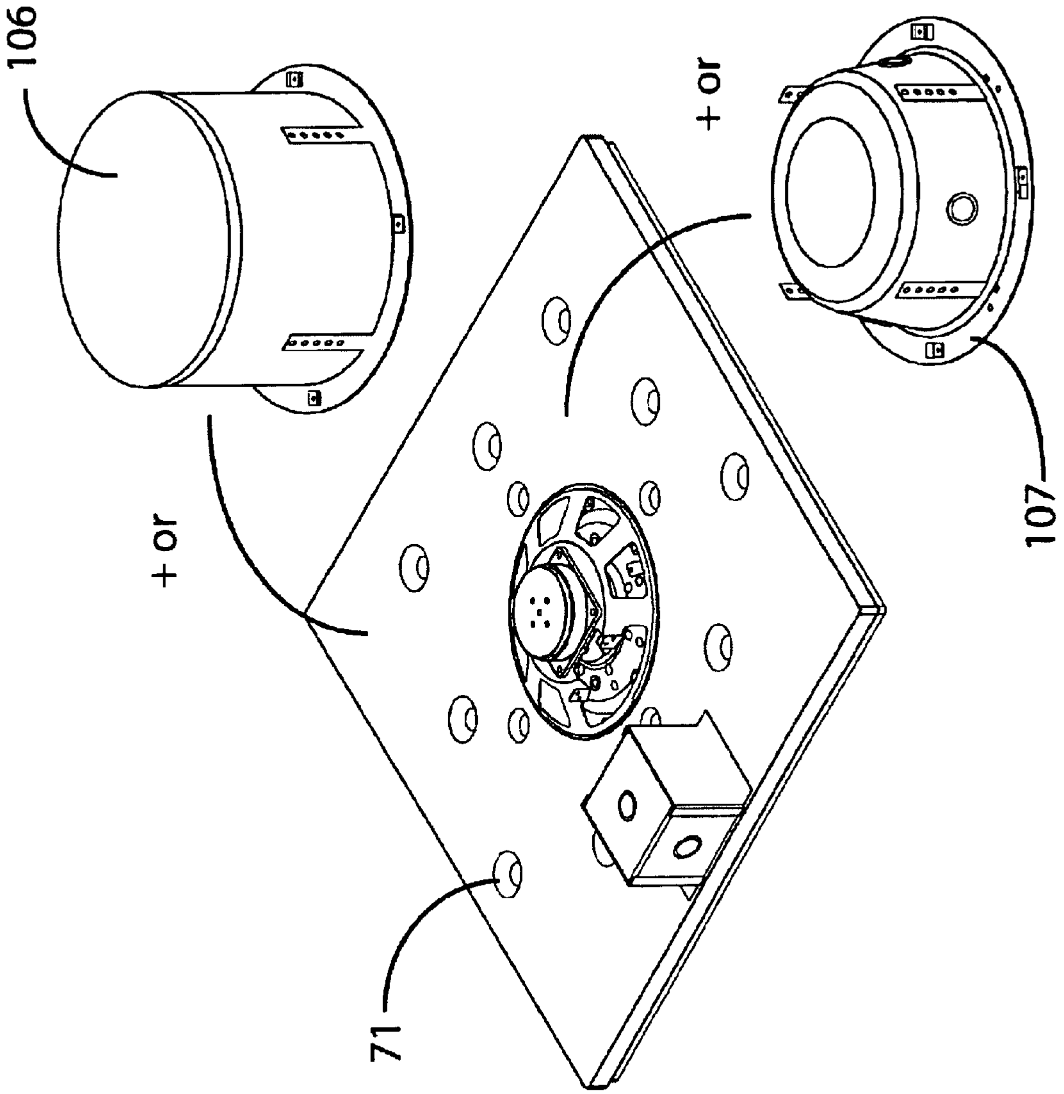
FIG. 15B is an isometric sketch showing the enclosure separated from the shroud that covers the rear of the loudspeaker, also with the indentations required to allow the loudspeaker to be installed flush-mounted or at pre-determined tegular-drop settings and the central driver support structure. The drawing also shows alternative, interchangeable enclosure sizes.

An alternative embodiment is presented—FIG. 15B—where the enclosure is a separate component from the shroud 70 that covers the rear of the loudspeaker. Such embodiment not only allows the same flush-mount or tegular-drop options mentioned before, but also permits the use of different enclosures 106–107, giving more flexibility or installation options.

Figure 16A:
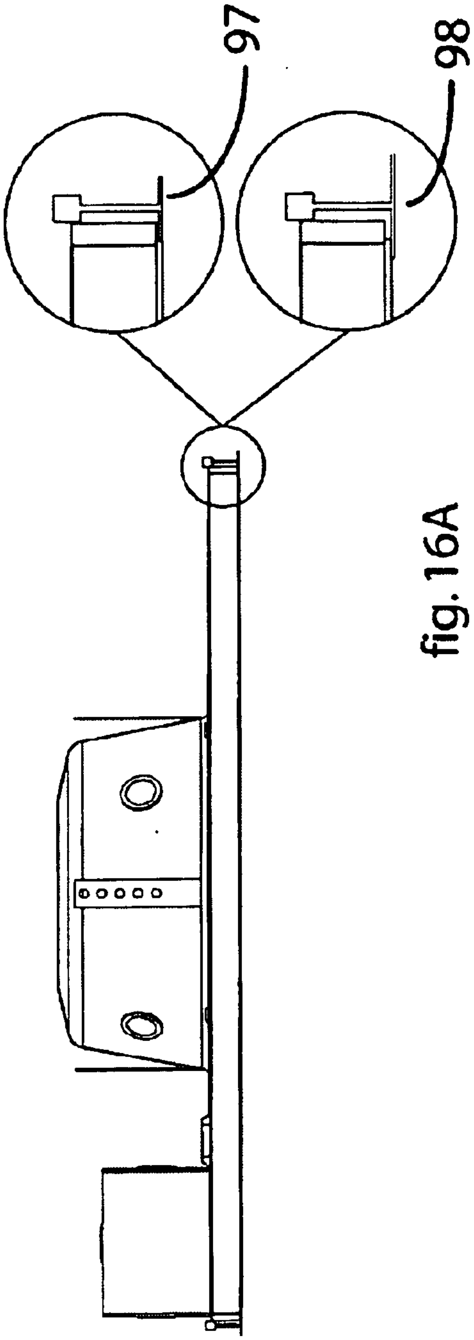
FIG. 16A is a side view of the planar loudspeaker (with enlarged detail views of the loudspeaker edge) resting on a 9/16" T-bar grid and a 15/16" T-bar grid.

Typically, suspended ceilings grids have two types of exposed tees, as shown in the enlarged views of FIG. 16A.

Such are known as 9/16" tees 97 or 15/16" tees 98, whereas the dimension indicates the width of the tee profile (in inches) and whereas each type is to be interfaced with the corresponding ceiling tile profile for a proper match. The flush-mount or tegular drop settings explained herein are applicable to either type of tee profiles.

Figure 16B:
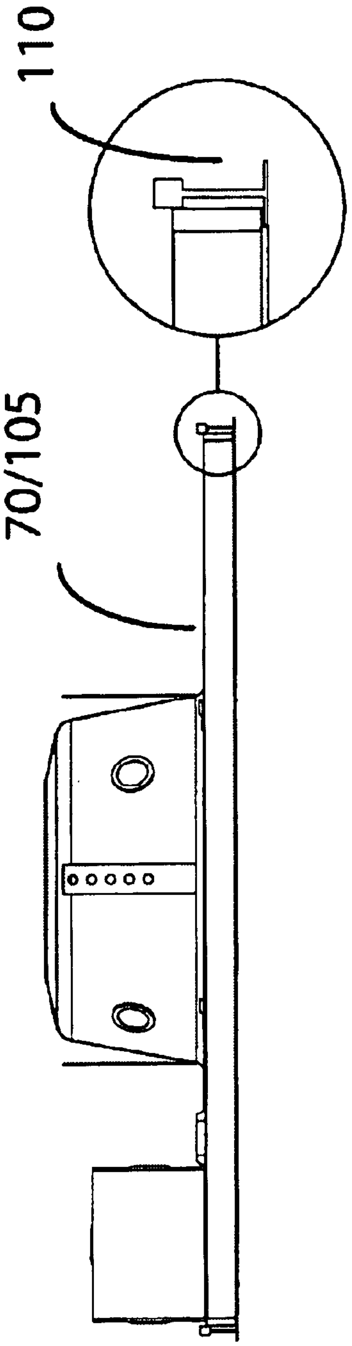
FIG. 16B is a side view of the planar loudspeaker (with enlarged detail view) assembled in a first position so as to be set in the suspended grid for a flush-mount installation.
Figure 16C:
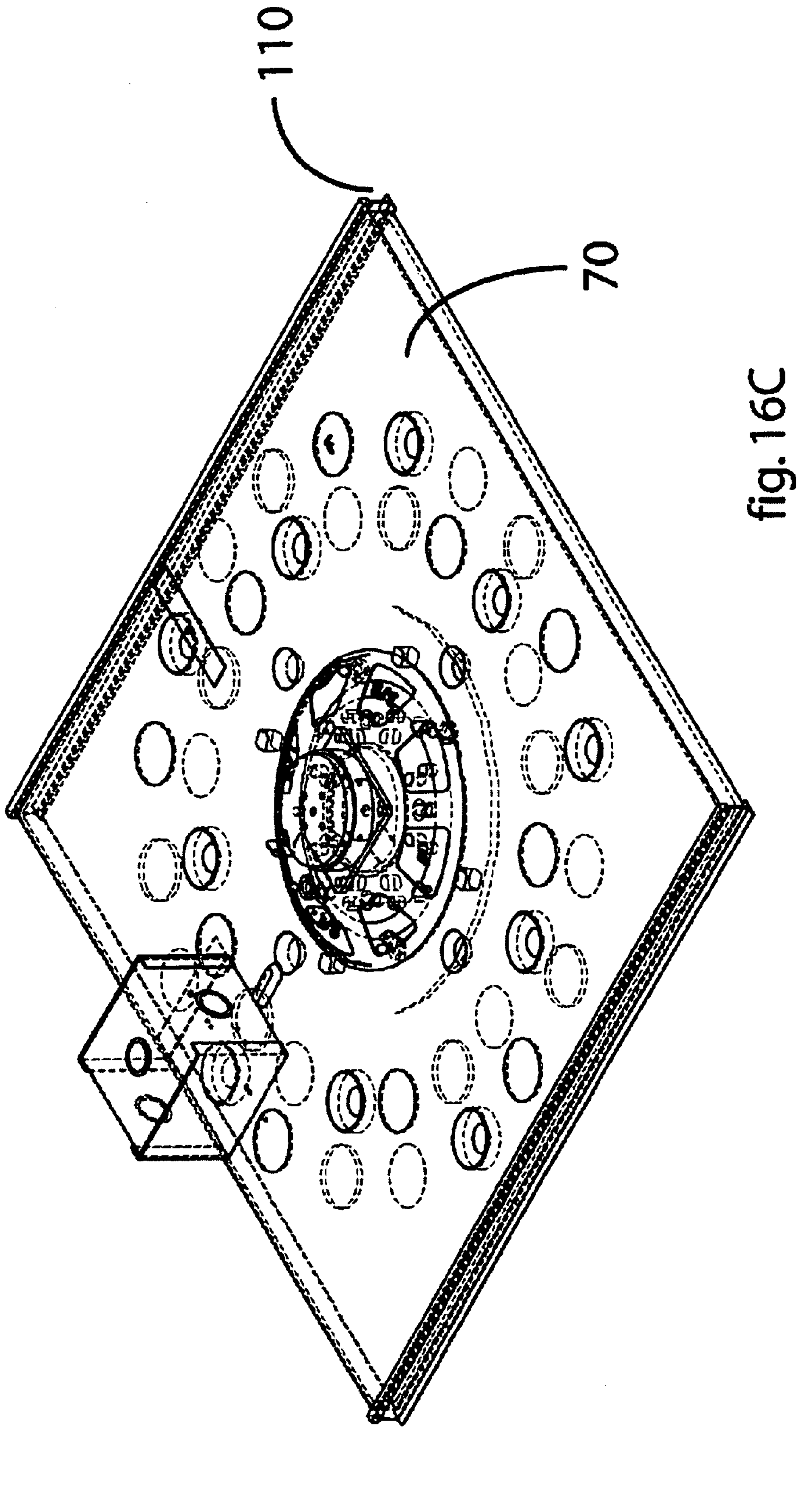
FIG. 16C is an isometric view of the planar loudspeaker with the covering shroud assembled in a first position so as to be set in the suspended grid for a flush-mount installation.

Going back to the flush or tegular-drop settings that can be obtained by particularly arranging the indentations 71 of the shroud 70 or the indentations 71 of the integrated enclosure and shroud 105 respect to the recesses 101 or protuberances 102 in the rear surface 103 of the diaphragm 100, a first position is identified where the loudspeaker is to be set for a flush-mount 110 installation. Such setting is illustrated on FIG. 16B and FIG. 16C.

Figure 16D:
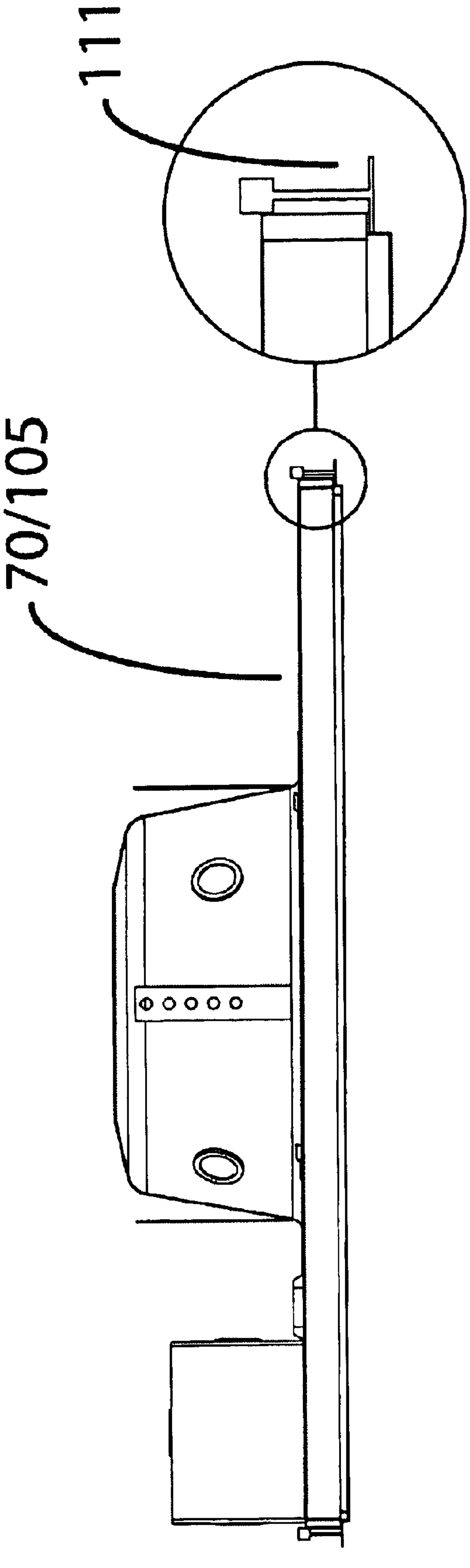
FIG. 16D is a side view of the planar loudspeaker (with enlarged detail view) assembled in a second position so as to be set in the suspended grid for a tegular-drop of 1/8".
Figure 16E:
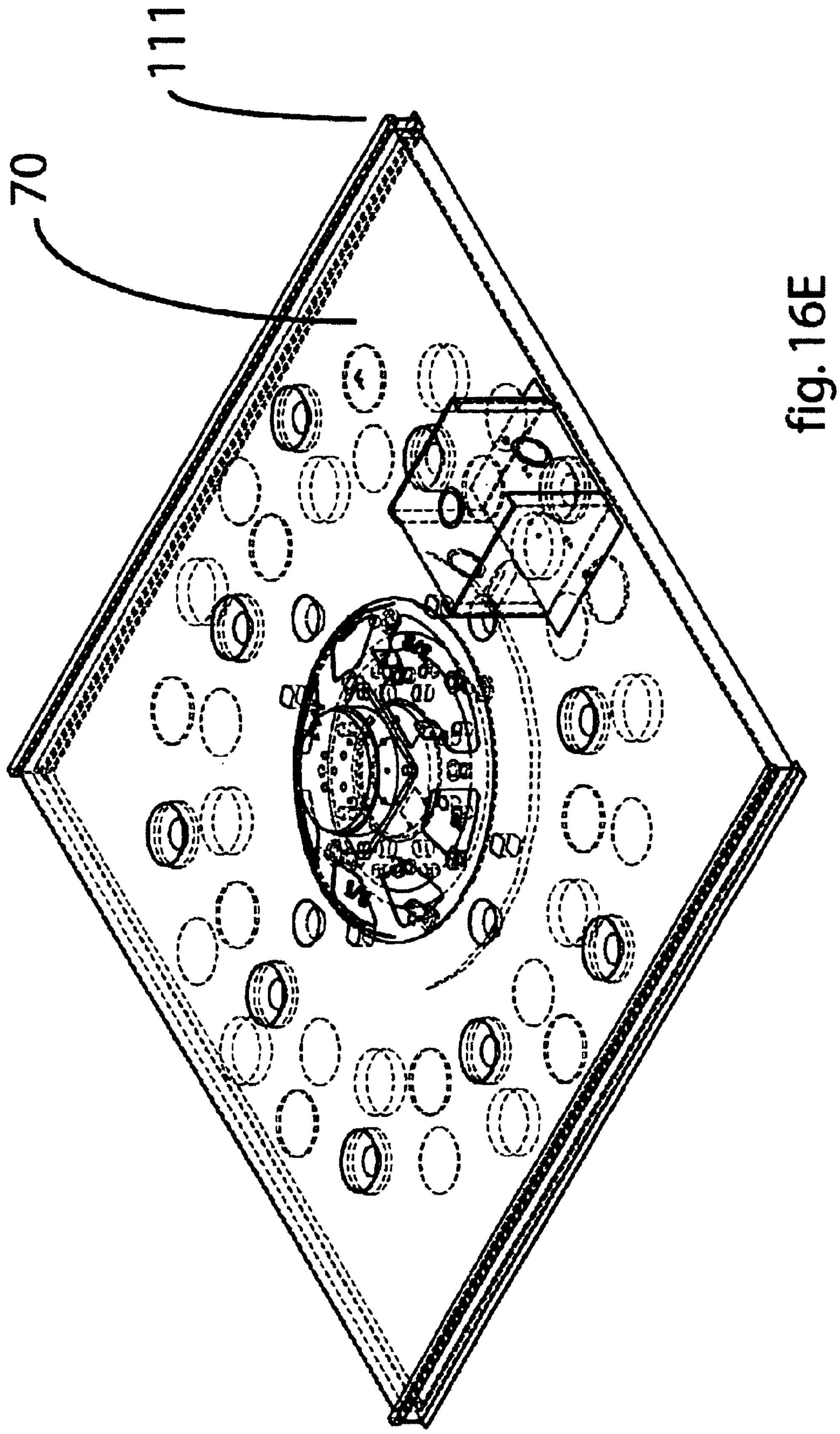
FIG. 16E is an isometric view of the planar loudspeaker with the covering shroud assembled in a second position so as to be set in the suspended grid for a tegular-drop of 1/8".
Figure 16F:
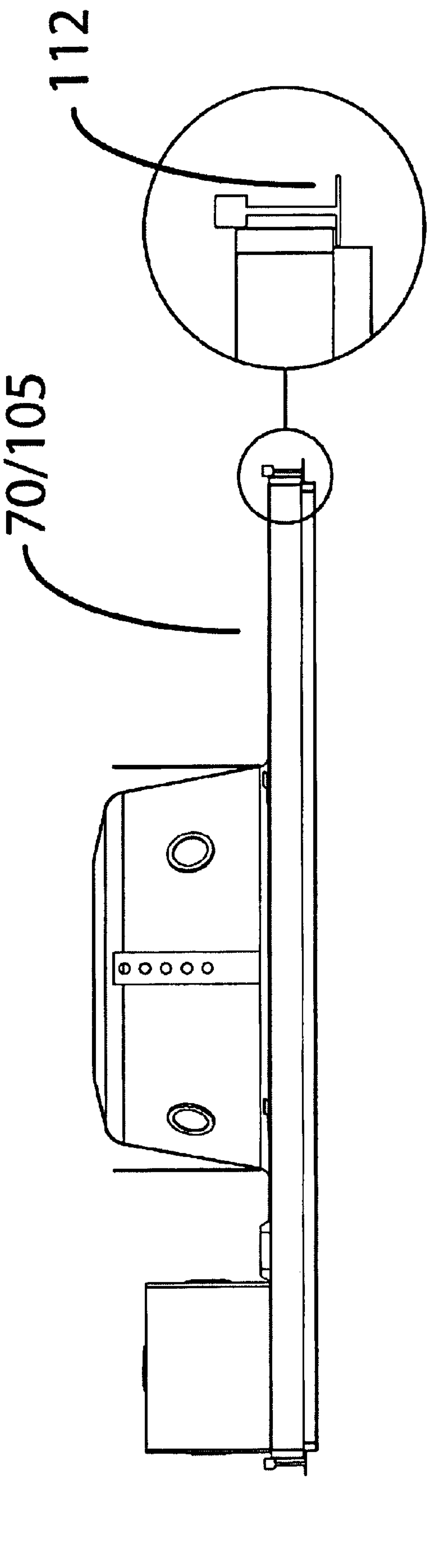
FIG. 16F is a side view of the planar loudspeaker (with enlarged detail view) assembled in a third position so as to be set in the suspended grid for a tegular-drop of 1/4".
Figure 16G:
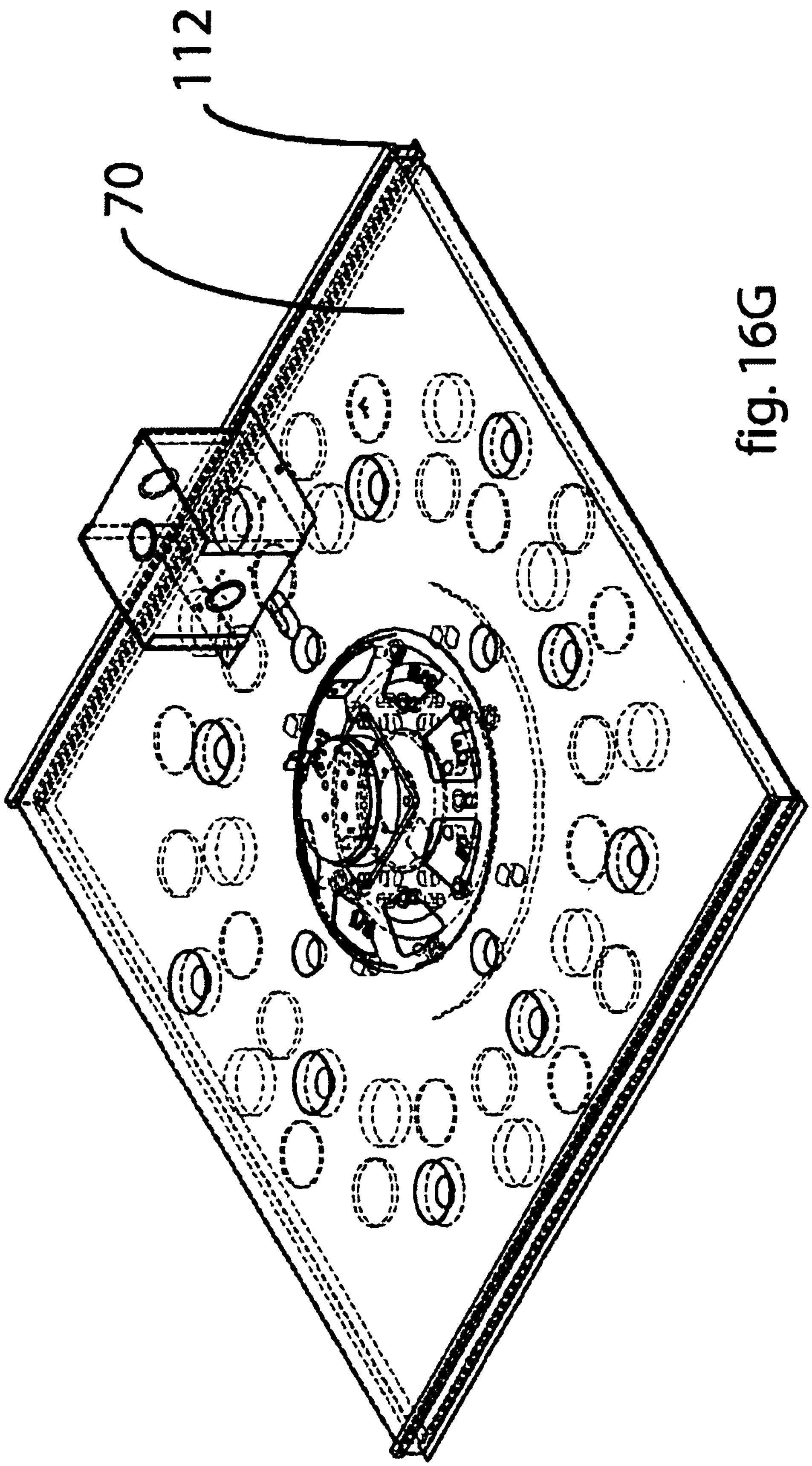
FIG. 16G is an isometric view of the planar loudspeaker with the covering shroud assembled in a third position so as to be set in the suspended grid for a tegular-drop of 1/4".
Figure 16H:
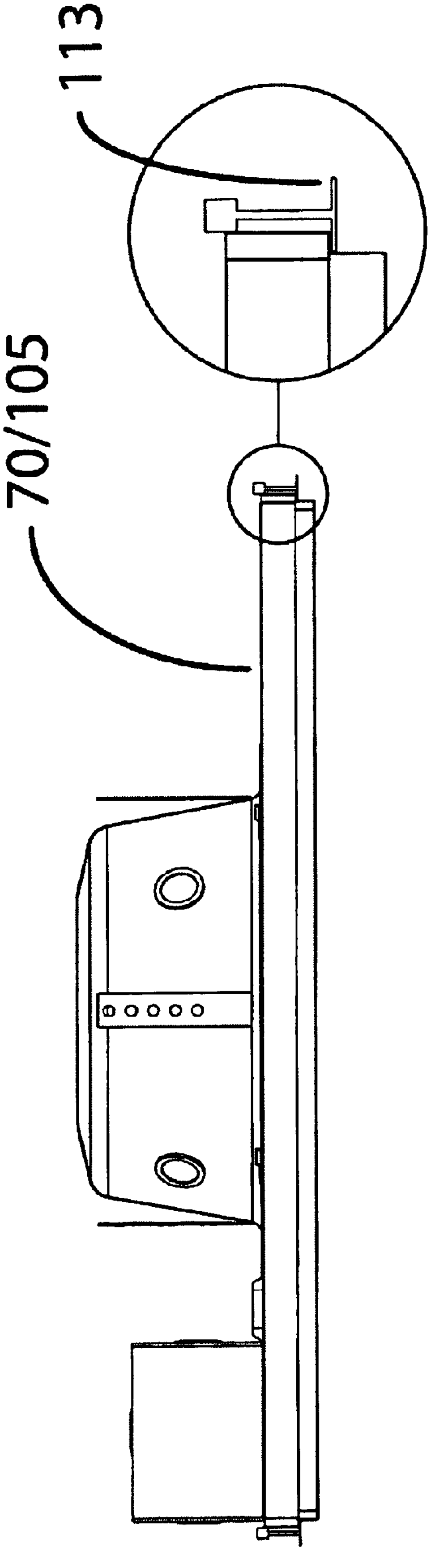
FIG. 16H is a side view of the planar loudspeaker (with enlarged detail view) assembled in a fourth position so as to be set in the suspended grid for a tegular-drop of 3/8".
Figure 16J:
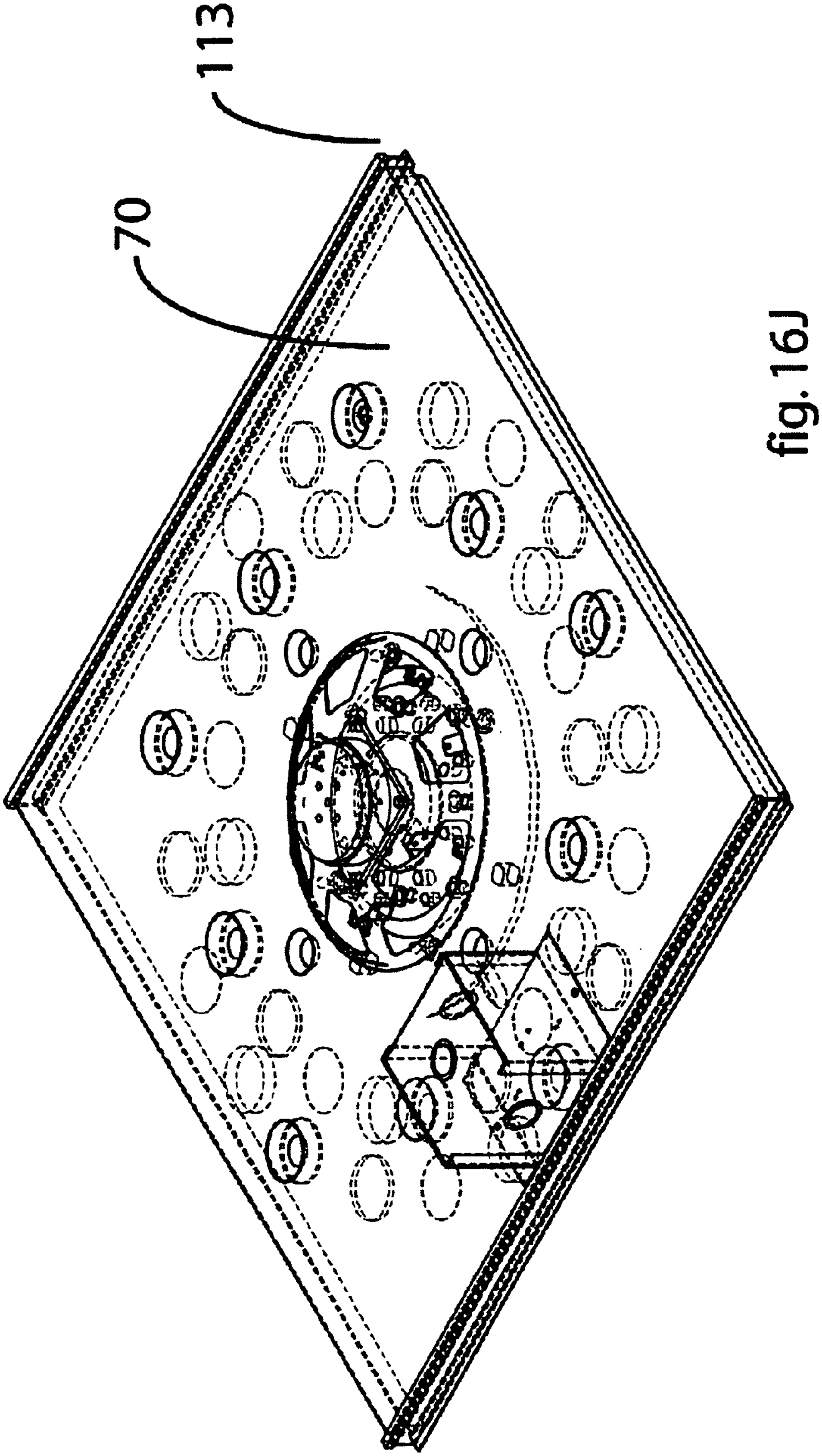
FIG. 16J is an isometric view of the planar loudspeaker with the covering shroud assembled in a fourth position so as to be set in the suspended grid for a tegular-drop of 3/8".

By rotating the shroud 70 or integrated enclosure and shroud 105 90° with respect to the diaphragm position (a second position), the loudspeaker front surface now matches a ceiling system with a tegular-drop 111 of ⅛". Such setting is illustrated on FIG. 16D and FIG. 16E. By rotating the shroud 70 or integrated enclosure and shroud 105 another 90° clockwise (a third position), the loudspeaker front surface now matches a ceiling system with a tegular-drop 112 of ¼". Such setting is illustrated on FIG. 16F and FIG. 16G. By rotating the shroud 70 or integrated enclosure and shroud 105 another 90° clockwise (a fourth position), the loudspeaker front surface now matches a ceiling system with a tegular-drop 113 of ⅜". Such setting is illustrated on FIG. 16H and FIG. 16J.

C. Diaphragm Densities

As previously mentioned, the diaphragm may include regions of different densities. Beneficially, multiple densities provide improvements in sound quality in the low and high frequency portions of the audio bandwidth. In addition, the diaphragm may include an outer region, having a density of at least 5 pounds per cubic foot (pcf) about the periphery region of the diaphragm to provide structural stiffness, thus eliminating the need of an outer frame and resilient suspension. Moreover, related methods of manufacture provide a product that is easier and less costly to manufacture, while it has a reduced component count.

Figure 17A:
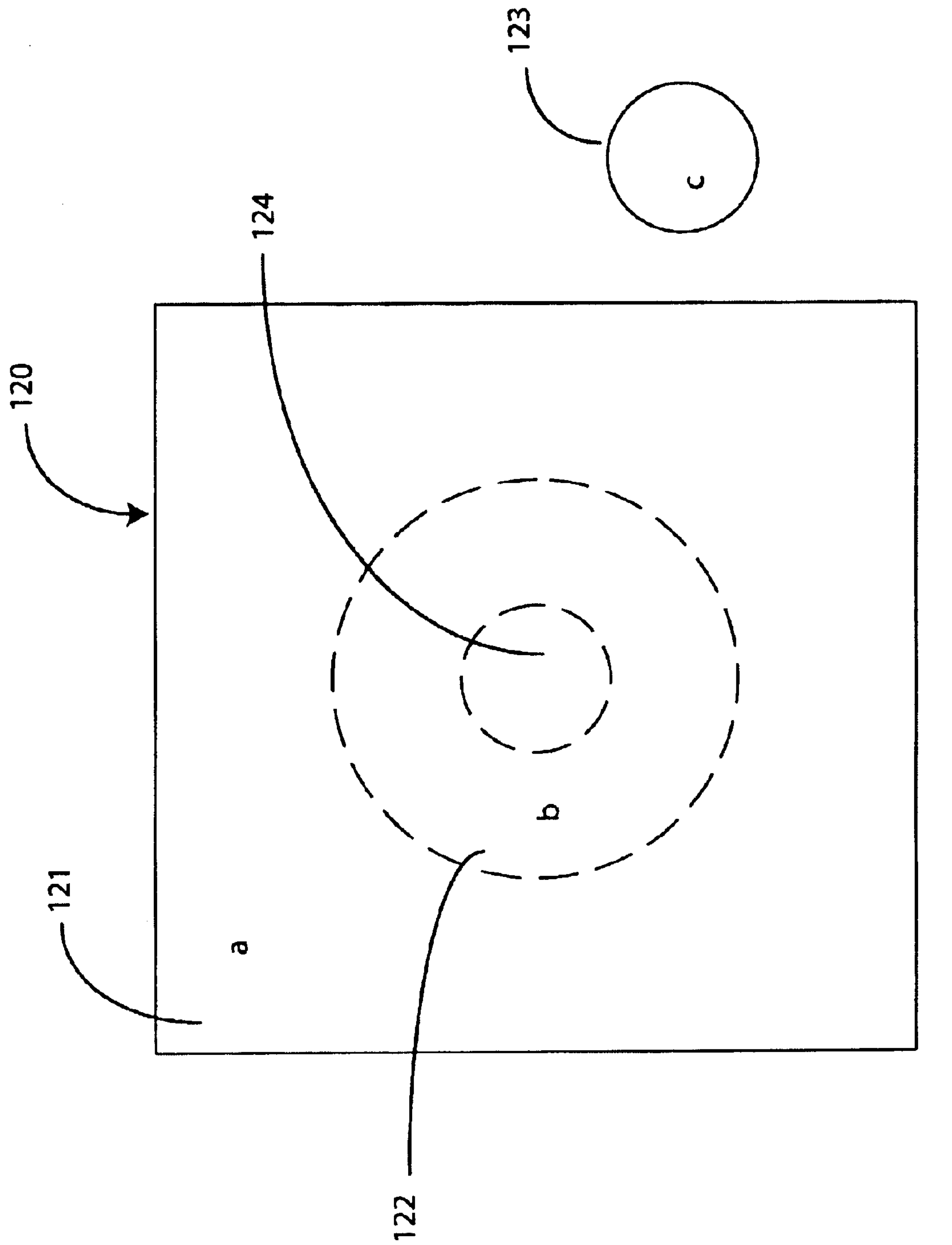
FIG. 17A is an elevation view showing a dual-density loudspeaker diaphragm, where the "a" section is of very high density, "b" section is low density and "c" is a separate part made of high density, and adhered to the center of the "b" section.

FIG. 17A shows a dual-density loudspeaker diaphragm 120, where the "a" region 121 is of very high density, "b" region 122 is of a low density and where "c" is a separate part 123 made of high density, and tailored to be adhered to the center 124 of the "b" region.

Figure 17B:
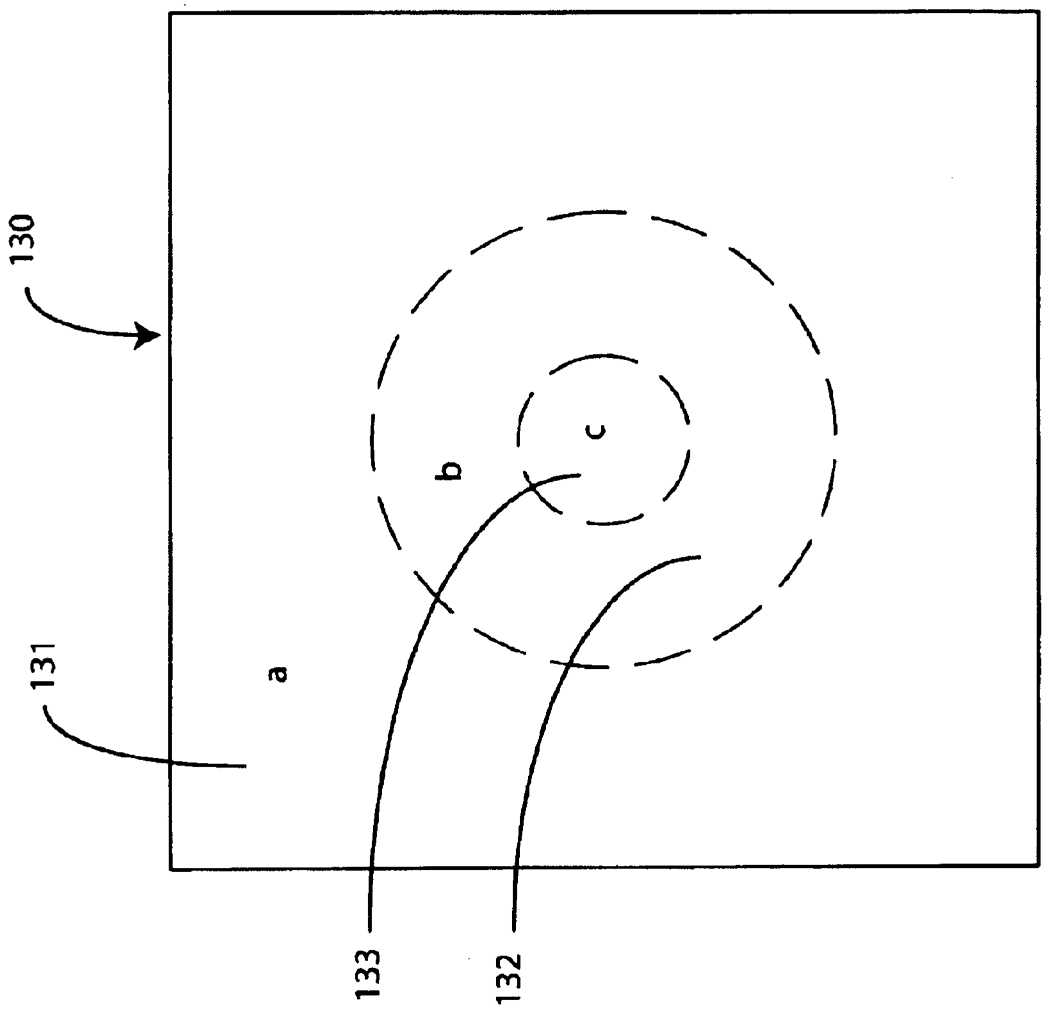
FIG. 17B is an elevation view showing a triple-density loudspeaker diaphragm, where the "a" section is of very high density, "b" section is low density and "c" is of high density, and whereas the whole diaphragm is molded in a single operation.

Alternatively, FIG. 17B shows a triple-density loudspeaker diaphragm 130, where the "a" region 131 is of very high density, "b" region 132 is of low density and the "c" region 133 is of high density, and whereas the whole diaphragm 130 is molded in a single molding operation. Such mold cavity is fed by multiple injectors that supply different densities of the same material to different regions of the diaphragm, whereas each region of the diaphragm—as named "a", "b" and "c" in the illustration—can be separately defined by gates or blockages before the mold cavity is filled with material, but the gates are opened during the molding process, allowing for a complete fusion of the material in the different regions without a visible trace in between each area.

Figure 17C:
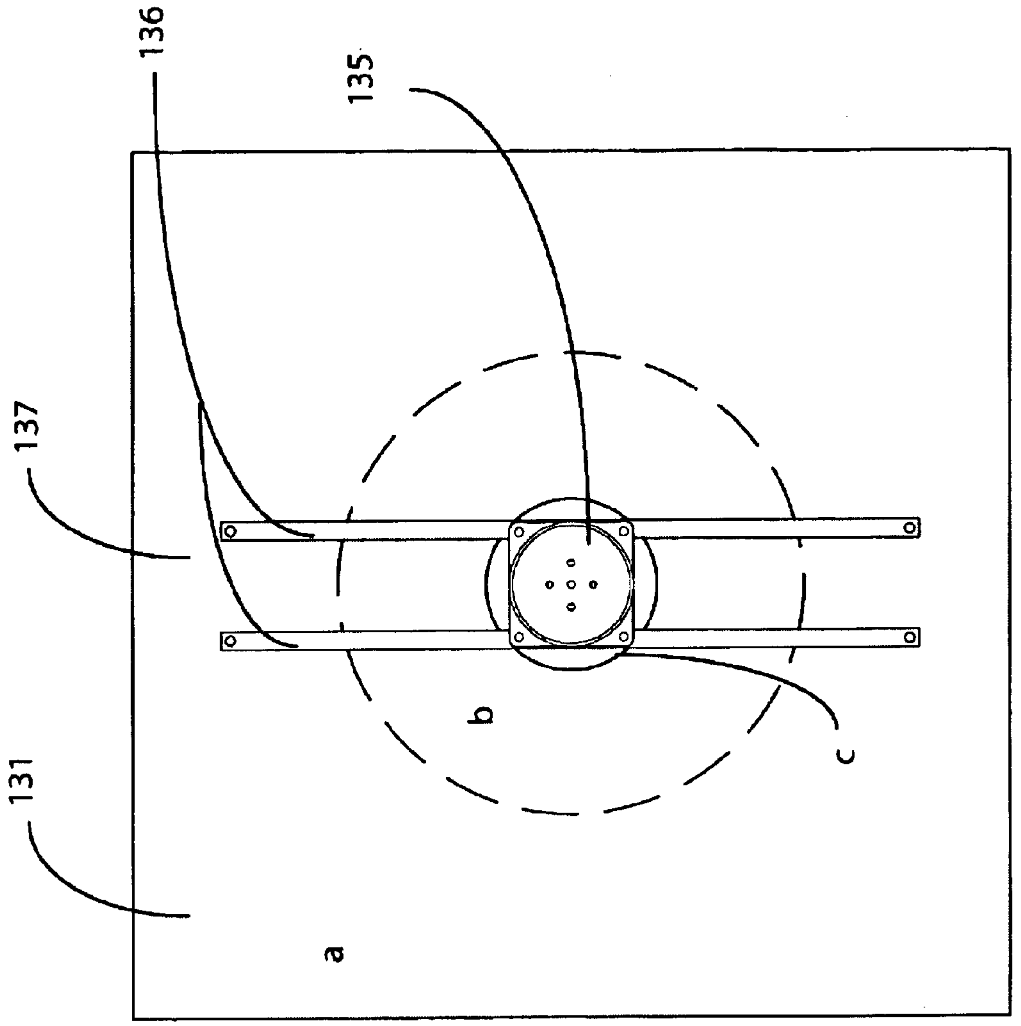
FIG. 17C is an elevation view showing a triple-density loudspeaker as described on FIG. 17B, showing a driver assembly supported by a bridge, which is resting on the "a" section.

FIG. 17C illustrates the aforementioned, displaying a triple-density loudspeaker diaphragm showing a driver assembly 135 supported by a bridge 136, which is resting on vertical supports 137 over the "a" region 131 made of very-high density material. The "a" region circumscribes the "b" and "c" regions and has a density of at least 5 pcf. Both the "b" and "c" regions have a density at or below about 3 pcf. In this embodiment, the "b" region has a density between 1.5 pcf and 2 pcf, and the "c" region has a density between 2 pcf and 3 pcf.

The present invention has been described above in terms of presently preferred embodiments so that an understanding of the present invention can be conveyed. However, there are other methods, finishes and/or configurations for planar diaphragm loudspeakers not specifically described herein for which the present invention is applicable. Therefore, the present invention should not to be seen as limited to the form shown, which is to be considered illustrative rather than restrictive. Accordingly, the invention is defined only by the claims set forth below.

What is claimed is:

1. A planar diaphragm loudspeaker for use in a suspended ceiling grid defining rectangular openings, comprising:

a rectangular, planar diaphragm formed of polymer material, the diaphragm sized to fit an opening of the ceiling grid, the diaphragm having a unitary construction to include a front surface and a rear surface, the front surface of the diaphragm defining a three-dimensional, textured pattern across the entirety of the front surface; and an electromagnetic driver coupled to the rear surface of the diaphragm such that the driver will cause the front surface of the diaphragm to vibrate and reproduce sound in response to an electrical signal.

2. A loudspeaker as set forth in claim 1, wherein the textured pattern is formed of perforations or indentations in the front surface of the diaphragm.

3. A loudspeaker as set forth in claim 1, wherein the textured pattern is etched into the front surface of the diaphragm.

4. A loudspeaker as set forth in claim 1, wherein the diaphragm has regions of different densities, including an outer region about the periphery of the diaphragm, the density of the outer region being at least 5 pcf throughout the outer region, thereby enabling the loudspeaker to be free of a peripheral frame attached to the diaphragm, and an inner region circumscribed by the outer region, the density of the inner region being at or below about 3 pcf throughout the inner region.

5. A loudspeaker as set forth in claim 1, further comprising a shroud secured to the diaphragm; wherein the shroud and the diaphragm are securable in a first orientation for flush mounting and in a second orientation for tegular-drop mounting.

6. A planar diaphragm loudspeaker for use in a suspended ceiling grid defining rectangular openings, comprising:

a rectangular, planar diaphragm of polymer material sized to fill an opening of the ceiling grid and having a front surface and a rear surface, the front surface defining a three-dimensional, textured pattern across the front surface; the diaphragm having regions of different densities, including an outer region about the periphery of the diaphragm, the density of the outer region being at least 5 pcf throughout the outer region, and an inner region circumscribed by the outer region, the density of the inner region being at or below about 3 pcf throughout the inner region;

a bracket rigidly attached to the diaphragm at two spaced locations in the outer region, the bracket extending across the inner region between the spaced location; and a first electromagnetic driver coupled to the bracket and coupled of the rear surface of the diaphragm within the inner region.

7. A loudspeaker as set forth in claim 6, further comprising a shroud secured to the diaphragm; wherein the shroud and the diaphragm are securable in a first orientation for flush mounting and in a second orientation for tegular-drop mounting.

8. A loudspeaker as set forth in claim 6, wherein:

the inner region includes a first region having a density between 1.5 pcf and 2 pcf and a second region having a density between 2 pcf and 3 pcf;

the first electromagnetic driver is coupled to the rear surface of the diaphragm within the first region; and the loudspeaker further comprises a second electromagnetic driver coupled to the bracket and coupled to rear surface of diaphragm within the second region thereof.

9. A loudspeaker as set forth in claim 6, wherein the diaphragm is a unitary piece and the textured pattern is formed of perforations or indentations in the front surface of the diaphragm.

10. A loudspeaker as set forth in claim 6, wherein the diaphragm includes granular material attached to the front surface thereof, thereby defining the textured pattern.

11. A loudspeaker as set forth in claim 6, wherein the textured pattern is formed of a fiber compound adhered to the front surface of the diaphragm.

12. A loudspeaker as set forth in claim 6, wherein the diaphragm is a unitary piece and the textured pattern is etched into the front surface of the diaphragm.

13. A method of manufacturing a planar diaphragm loudspeaker for use in a suspended ceiling grid defining rectangular openings, the method comprising:

producing a rectangular diaphragm of polymer material sized to fit an opening of the ceiling grid, the diaphragm having a unitary construction to include a generally smooth front surface and a rear surface;

subjecting the diaphragm to a secondary operation to define a three-dimensional, textured pattern across the front surface of the diaphragm such that the front surface of the diaphragm contributes to the three-dimensional, textured pattern;

coupling an electromagnetic driver to the rear surface of the diaphragm such that the driver will cause the front surface of the diaphragm to vibrate and reproduce sound in response to an electrical signal.

14. A method as set forth in claim 13 wherein the textured pattern is formed of perforations or indentations in the front surface of the diaphragm.

15. A method as set forth in claim 13, wherein the diaphragm includes granular material attached to the front surface thereof, thereby defining the textured pattern.

16. A method as set forth in claim 13, wherein the textured pattern is formed of a fiber compound adhered to the front surface of the diaphragm.

17. A method as set forth in claim 13, wherein the textured pattern is etched into the front surface of the diaphragm.

18. A method as set forth in claim 13, wherein the diaphragm includes an outer region about the periphery of the diaphragm, the density of the outer region being at least 5 pcf throughout the outer region, and an inner region circumscribed by the outer region, the density of the inner region being at or below about 3 pcf throughout the inner region, thereby providing sufficient structural stiffness to the outside perimeter of the diaphragm and eliminating the need of an outer frame; and the method further comprising attaching a bracket to the diaphragm at two spaced locations in the outer region, the bracket extending across the inner region between the spaced locations, the electromagnetic driver being coupled to the bracket such that it is attached to the inner region of the diaphragm.

19. A method as set forth in claim 18, wherein the subjecting step is performed by attaching a sheet to the front surface thereof.

* * * * *